United States Patent
Lye et al.

(10) Patent No.: US 9,225,508 B1
(45) Date of Patent: Dec. 29, 2015

(54) LOW-NOISE FLEXIBLE FREQUENCY CLOCK GENERATION FROM TWO FIXED-FREQUENCY REFERENCES

(71) Applicant: PMC-SIERRA US, INC., Sunnyvale, CA (US)

(72) Inventors: William Michael Lye, Coquitlam (CA); Hormoz Djahanshahi, Port Moody (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 14/791,329

(22) Filed: Jul. 3, 2015

Related U.S. Application Data

(63) Continuation of application No. 14/295,742, filed on Jun. 4, 2014, now Pat. No. 9,112,517.

(60) Provisional application No. 61/831,095, filed on Jun. 4, 2013.

(51) Int. Cl.
  *H03L 7/18* (2006.01)
  *H03L 7/093* (2006.01)
  *H04L 7/033* (2006.01)
  *H04L 7/00* (2006.01)

(52) U.S. Cl.
  CPC ............ *H04L 7/0331* (2013.01); *H04L 7/0025* (2013.01)

(58) Field of Classification Search
  USPC .......... 327/105–123, 141, 144–163; 331/1/A, 331/15–17; 375/373–378
  See application file for complete search history.

(56) References Cited

U.S. PATENT DOCUMENTS

| | | | | |
|---|---|---|---|---|
| 4,234,852 A * | 11/1980 | McCorkle | ...................... | 329/302 |
| 4,322,692 A * | 3/1982 | Brewerton et al. | ............... | 331/2 |
| 5,739,727 A * | 4/1998 | Lofter et al. | .................... | 331/11 |
| 6,094,569 A * | 7/2000 | Wang | ............................ | 455/313 |
| 6,297,703 B1 * | 10/2001 | Martin et al. | ...................... | 331/2 |
| 6,870,503 B2 | 3/2005 | Mohamadi | | |
| 7,295,077 B2 | 11/2007 | Thomsen et al. | | |
| 7,436,227 B2 | 10/2008 | Thomsen et al. | | |
| 7,492,195 B1 * | 2/2009 | Patil | ............................ | 327/156 |
| 7,525,392 B2 | 4/2009 | Tarng | | |

(Continued)

FOREIGN PATENT DOCUMENTS

WO 2009/081326 7/2009

OTHER PUBLICATIONS

U.S. Appl. No. 14/295,742, Restriction Requirement dated Oct. 28, 2014.

(Continued)

*Primary Examiner* — Brandon S Cole
(74) *Attorney, Agent, or Firm* — Dennis R. Haszko

(57) ABSTRACT

A number of methods and clock generator units are disclosed to produce low Phase Noise clocks for use in Radio Frequency systems. The methods and clock generator units all use two reference clocks: a frequency-accurate reference that has comparatively high Phase Noise, and a frequency-inaccurate reference such as that from a BAW or MEMS clock source that has comparatively low Phase Noise. By combining multiple Phase-Locked Loops and a mixer, it is possible to produce flexible output frequencies whose frequency accuracy is derived from the first reference clock but whose Phase Noise level is derived from the second reference clock, all in a readily-integrated and relatively low-cost system.

14 Claims, 18 Drawing Sheets

(56) References Cited

U.S. PATENT DOCUMENTS

| | | |
|---|---|---|
| 7,623,837 B2 | 11/2009 | Cathelin et al. |
| 7,986,190 B1 | 7/2011 | Lye |
| 8,040,190 B2 | 10/2011 | Ruffieux |
| 8,204,143 B2 | 6/2012 | Ravid et al. |
| 8,756,451 B2 * | 6/2014 | Neidengard et al. .......... 713/501 |
| 2001/0048329 A1 * | 12/2001 | Sumi .............................. 327/156 |
| 2003/0029631 A1 * | 2/2003 | Bassett et al. ................. 174/250 |
| 2006/0186930 A1 * | 8/2006 | Klage ........................... 327/105 |
| 2012/0015610 A1 | 1/2012 | Ruffieux |

OTHER PUBLICATIONS

U.S. Appl. No. 14/295,742, Notice of Allowance dated May 11, 2015.

\* cited by examiner

Figure 8
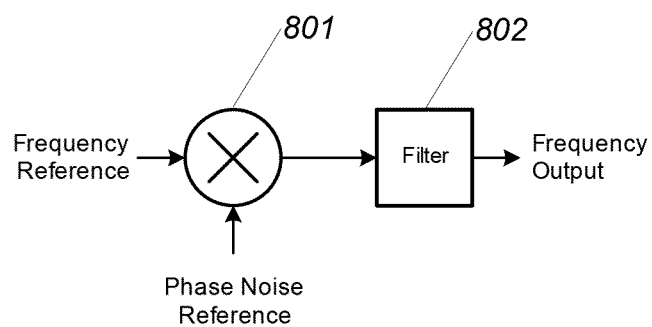
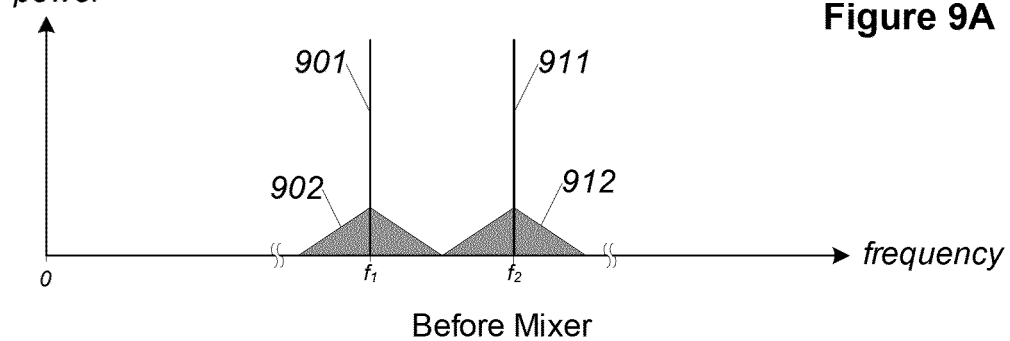
Before Mixer
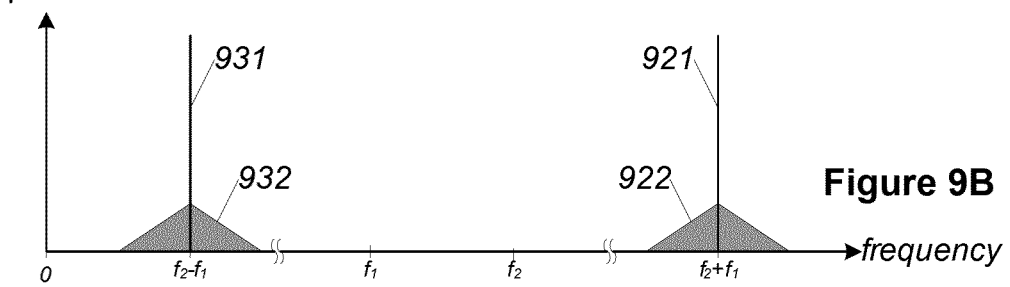
After Mixer
Figure 9A
Figure 9B

LOW-NOISE FLEXIBLE FREQUENCY CLOCK GENERATION FROM TWO FIXED-FREQUENCY REFERENCES

CROSS REFERENCE TO RELATED APPLICATIONS

This application is a Continuation of U.S. patent application Ser. No. 14/295,742, filed Jun. 4, 2014, which claims the benefit of priority of U.S. Provisional Patent Application No. 61/831,095 filed Jun. 4, 2013. The contents of U.S. patent application Ser. No. 14/295,742 and of U.S. Provisional Patent Application No. 61/831,095 are hereby incorporated by reference.

FIELD

The present disclosure relates generally to radio frequency (RF) systems. More particularly, the present disclosure relates to systems and methods of RF systems that require a wide tuning range and low Phase Noise integrated clock generators.

BACKGROUND

Effects of local oscillator (LO) noise on RF systems:

In many RF systems, the Phase Noise of a LO clock source is a key concern in designing the system. An example of quadrature RF receiver is shown in FIG. 1, while an example of a quadrature RF transmitter is shown in FIG. 2.

In the quadrature RF Receiver of FIG. 1, an RF signal is received by an antenna 101, amplified by a Low-Noise Amplifier (LNA) 102, and then down-converted from RF to an Intermediate Frequency (IF) or Baseband (BB, sometimes also known as "Zero-IF" or ZIF) by mixing an output from the LNA 102 with two versions of a LO clock source using mixers 104. One copy of the LO clock source is shifted by a quarter phase, illustrated by a phase shifter 105. The outputs from the mixers 104 are then filtered by two Low-Pass Filters 106 for further processing. The Quadrature RF Transmitter of FIG. 2 is qualitatively similar, but operates in reverse. As shown in FIG. 2, two BB/IF signals are up-converted to RF using two mixers 204, summed together by a summing device 203, and finally amplified by a Power Amplifier (PA) 202 for transmission over an antenna 201. In these Figures, and in all succeeding figures in this document, an attempt is made to use common numbering schemes for common elements for clarity.

There are many alternate forms that RF systems can take beyond what is shown in FIG. 1 and FIG. 2, and the details of their construction are beyond the scope of this document; however, almost all structures involve mixing signals with LO clock sources to convert BB/IF signals to RF or vice versa. There are many possible mixer structures, and the details of their construction are also beyond the scope of this document, however at their core they can all be modeled as analog multipliers. Applying two sinusoidal inputs to an analog multiplier:

$$i_1 = \cos(2 \cdot \pi \cdot f_1 \cdot t)$$

$$i_2 = \cos(2 \cdot \pi \cdot f_2 \cdot t) \quad \text{Equation 1}$$

Results in:

$$\begin{aligned} i_1 \cdot i_2 &= \cos(2 \cdot \pi \cdot f_1 \cdot t) \cdot \cos(2 \cdot \pi \cdot f_2 \cdot t) \\ &= \frac{1}{2} \cdot (\cos(2 \cdot \pi \cdot (f_1 + f_2) \cdot t) + \cos(2 \cdot \pi \cdot (f_1 - f_2) \cdot t)) \end{aligned} \quad \text{Equation 2}$$

In other words, the act of multiplying two pure sinusoids results in two other sinusoids, one at the "sum" frequency (i.e., $f_1 + f_2$), the other at the "difference" frequency (i.e., $f_1 - f_2$). In many RF applications, typically one of these two frequencies is desired while the other (known as the "image") is not and is rejected at the output, using for example, filters or trigonometric identities.

FIGS. 3A and 3B show the Power Spectral Density (PSD) of one possible frequency plan for a Single-Frequency Receive RF system and shows the effect of LO Phase Noise at the output. Before the mixer, at FIG. 3A, an LO clock source 301 and an RF signal 311 are present, while after the mixer, FIG. 3B, there are two signals (two signal components), the desired "difference" signal 313 (frequency difference component) at IF and the undesired "sum" signal 314 (frequency sum component) at a much higher frequency, which can be removed with a Low-Pass Filter (e.g., the Low-Pass Filters 106 in FIG. 1). The effects of Phase Noise 302 on the LO clock source 301 (FIG. 3A) are also shown at FIG. 3B, and result in spectral growth of the RF signals 315 and 316 at the mixer output.

The LO Clock Source Phase Noise 302, when looked at on a PSD plot as in FIG. 3A, is usually expressed in the units of decibel per hertz with respect to carrier power, or dBc/Hz, i.e., the amount of Phase Noise power present in 1 Hz of bandwidth relative to the power of the LO tone.

In broadband applications such as telecommunication, Phase Noise is often expressed using terms such as Integrated RMS Jitter or Total Jitter, often measured in femtoseconds (fs) or picoseconds (ps). However in RF applications it is often more appropriate to talk about Phase Noise in dBc/Hz at certain frequency offsets from the carrier, for example "−153 dBc/Hz at 800 kHz offset". To understand why, FIGS. 4A and 4B show a frequency plan for a multi-carrier RF Receiver, where the desired signal 411 is present but at a much lower power than a second signal (also known as a "Blocker" signal) at an adjacent carrier frequency 421. After being subjected to a mixer, the two output signals from the desired RF channel 411 (FIG. 4A) are present as signals 413 and 414 (FIG. 4B), as are the two output signals from the Blocker signal 421 (FIG. 4A), namely signal 423 and 424 (FIG. 4B).

As before, the Phase Noise 302 (FIG. 4A) on the LO Clock Source results in spectral regrowth, however in the multi-carrier scenario the spectral regrowth 425 from the high-power blocker 425 appears in the IF band of the down-converted signal 413. Because it is impossible to remove this noise from the IF signal, this irreparably harms the Signal-to-Noise Ratio (SNR) of the down-converted signal 413, limiting the available information-carrying bandwidth of the RF Receiver in that channel. The spectral regrowth 315 (FIG. 3B) of a single-carrier system is typically much less disruptive than in a multi-carrier system because the regrowth power is proportional to the signal power, whereas in a multi-carrier system, the regrowth power is proportional to the blocker's signal power, which, depending upon a number of factors, can be much higher.

Because Multi-Carrier RF Transmit systems are usually dealing with multiple RF signals of similar power, spectral regrowth concerns due to LO Phase Noise is often less of an issue than in Multi-Carrier RF Receive systems, but should still be considered.

Phase-Locked Loops and Phase Noise:

There is great deal of information known to those skilled in the art dealing with modeling of Phase Noise in general and LO Phase Noise in specific; however it is beyond the scope of this document to discuss this in great detail. In summary, all electronic components are capable of generating and modifying Phase Noise, with different generation or modification characteristics depending upon the component. It is, however, appropriate to provide some background on Phase Locked Loops and Phase Noise.

An elementary Phase Locked Loop (PLL) is shown in FIG. 5, and comprises a Phase Detector 501, a Loop Filter 502, and a Voltage-Controlled Oscillator (VCO) 503. The Phase Detector compares the relative phases of the Reference Clock input and the Output Clock from the VCO and, through negative feedback, produces a control signal that is in turn filtered by the Loop Filter to drive the VCO so that the relative phases of the two clocks are fixed.

The PLL of FIG. 5 has a simple configuration, however it demonstrates two key features. The first feature is that by locking the relative phases of the two inputs of the Phase Detector 501, the frequency of those inputs is also locked, i.e., the Output Clock frequency is the same as that of the Reference Clock.

The second key feature is that the PLL is a Phase Noise filter: every PLL has a loop bandwidth set by the characteristics of the loop components and, depending upon where Phase Noise is added in the system, this noise will see either a low-pass or a high-pass filter characteristic. For example, Phase Noise at the input to the Phase Detector 201 (coming either from the Reference Clock or from the Output Clock) will see a low-pass characteristic, whereas noise that arises from the VCO 503 will see a high-pass characteristic. Put another way, the Phase Noise seen at the Output Clock will be divided into two parts: below the loop bandwidth, the Output Clock Phase Noise will track the Phase Noise from the Reference Clock input (the Phase Noise from the PLL VCO component will be attenuated), while above the loop bandwidth, the Output Clock Phase Noise will track the Phase Noise generated by the VCO 503 (Phase Noise from the Reference Clock input will be attenuated).

It is important to note that the Phase Detector 501 is often a hybrid block, known as a Phase/Frequency Detector. During initial acquisition and while the frequencies at its input are radically different the block operates as a Frequency Detector, but when the input frequencies are close together the block operates as a Phase Detector. This dual operating mode is used to ensure reliable operation, and when alternative circuits are used for Phase Detection, provisions must be taken in the design to ensure that the block still locks to the correct frequency. The details of this are beyond the scope of this document but are well known to those skilled in the art.

Depending upon the required Phase Noise for the application and upon the components available, a system designer will attempt to choose a PLL bandwidth to meet these requirements. The designer is free to set the bandwidth as low as they desire, with practical limitations primarily arising from component choices for the Loop Filter 502, but the maximum bandwidth is limited by discrete-time effects to some fraction (often taken to be 1/10) of the Phase Detector input frequency. Assuming that the desire is for a low Phase Noise over a wide frequency range for use in a multi-carrier RF system and that an extremely low Phase Noise Reference Clock were available but the VCO had relatively large Phase Noise, the system designer would choose the PLL bandwidth to be as high as possible (for example, greater than or equal to the required low-noise frequency range) to suppress as much noise from the VCO as possible. Alternatively, if the Reference Clock had comparatively high Phase Noise (as is often the case if it is being provided by some sort of network timing system) but an extremely low Phase Noise VCO were available, the designer would choose a low PLL bandwidth (for example, lower (or much lower) than the carrier spacing) in order to suppress as much noise from the Reference Clock as possible.

The PLL of FIG. 5 is relatively limited because it passes its input frequency to its output with no modification. A more complex PLL, shown in FIG. 6, is capable of transforming one clock frequency to another by the addition of three dividers: a Feedback Divider 604, a Postscaler Divider 606, and a Prescaler Divider 607.

As before, once the PLL is locked, the inputs of the Phase Detector 501 are phase and frequency locked, however now the Output Clock frequency is determined by Equation 3:

$$F_{OUT} = \frac{F_{REF}}{M} \cdot \frac{N}{P} \qquad \text{Equation 3}$$

The Feedback Divider 604 causes the VCO output to be a multiplied version of the Phase Detector input, while the Postscaler divider 606 and the Prescaler divider 607 both act to produce a Final Output Clock with a frequency that is a rational fraction of the Reference Clock frequency. Even though the Output Clock frequency is a rational fraction of the Reference Clock frequency, this PLL is commonly referred to as an Integer-N PLL because all dividers are integers. Phase Noise of the PLL of FIG. 6 is similar to that of FIG. 5, in that the Output Phase Noise has both low-pass and high-pass components, but there are several new considerations that must be taken into account. First the addition of three dividers has created three new sources of Phase Noise that must be considered in the system budget. Second, the Phase Noise due to the Reference Clock at the Output is now multiplied by the same factor $N/(M \cdot P)$ as the frequency multiplication of Equation 3, which means that low Phase Noise systems should ideally have comparatively low multiplication factors. Third, Phase Noise due to the Loop Filter 502 and the VCO 503 is attenuated by the Postscaler Divider 606, which creates new opportunities for low Phase Noise systems if the desired frequencies are comparatively low. Fourth, certain non-idealities in the Phase Detector 501 and Loop filter 502 can create a Phase Noise "spur" at an offset frequency equal to the Phase Detector frequency, which creates new constraints in system frequency planning. Finally, the inclusion of the Prescaler 607 divider results in a lower frequency Fref/M at the Phase Detector 501 input, which reduces both the maximum available loop bandwidth and brings the Phase Detector spur location closer in frequency to the desired output clock.

In flexible RF systems, the frequency spacing at the output from the frequency-generating PLL is important. For an Integer-N PLL, frequency spacing at the VCO output is set by the Phase Detector input frequency, $F_{REF}/M$. Fine frequency spacing implies a comparatively low Phase Detector input frequency, however that requirement is at odds with what would be desirable for low Phase Noise: maximizing $F_{REF}$ while minimizing the multiplication factor $N/(M \cdot P)$. As a result, most RF systems use Fractional-N PLL's, instead of Integer-N PLL's.

An example of a Fractional-N PLL is shown at FIG. 7. The Fractional-N PLL replaces the Integer-N PLL fixed Feedback Divider 604 (FIG. 6) with a programmable Feedback Divider 704 and a Fractional-N Modulator 705 (FIG. 7). By introducing the programmable Feedback Divider 704 and the Fractional-N Modulator 705, the effective feedback divide ratio is given by Equation 4:

$$F_{OUT} = \frac{F_{REF}}{M} \cdot \frac{\overline{X}}{P} = \frac{F_{REF}}{M} \cdot \frac{n/d}{P} \qquad \text{Equation 4}$$

where $\overline{X}$ is the average value of X over time and $\overline{X}=n/d$, where n and d are the Numerator and Denominator of a rational fraction and are inputs to the Fractional-N modulator 705, which is often implemented using Delta-Sigma ($\Delta\Sigma$) techniques. The term Fractional-N comes from the inclusion of this rational fraction.

With this modification, the Phase Detector input frequency $F_{REF}/M$ can be significantly raised to no longer be the required frequency spacing, while at the same time, fine frequency resolution can be achieved by using large integer values for both n and d. In many practical Fractional-N PLL based Clock Generators, these coefficients are fairly large (perhaps 40 bits or more) to give ultra-fine frequency resolution. This increase of the Phase Detector frequency allows for wider PLL bandwidths and allows for the use of higher-frequency references, thereby reducing overall Phase Noise.

The addition of the Fractional-N divider subsystem (704 and 705) increases the Phase Noise seen at the input of the Phase Detector, however this Phase Noise will be attenuated by the PLL's low-pass filter characteristic before being seen at the output, and there are several techniques well known to those skilled in the art that allow for further reduction of low-frequency Phase Noise from this divider, minimizing its impact on the output.

Integrated Low Phase Noise LO Clock Generation Challenges:

The challenges of creating low Phase Noise LO clock sources in integrated forms are several. First and foremost, in many modern multi-carrier RF systems, low Phase Noise is required over frequency bands that cover extremely wide bandwidths, perhaps as high as 100-200 MHz. At the same time, the LO clock generator is required to have very fine frequency resolution, perhaps as low as 100 kHz. Additionally, the reference clocks available for generating the LO clock source are often derived from network timing references, and while they are extremely accurate in frequency, have poor Phase Noise characteristics.

Oscillators are fundamentally integrators, integrating frequency over time to produce phase, and are constructed by coupling an active circuit (an amplifier) to a narrow band-pass filter, often called a "resonator". The better the Quality factor (also known as "Q" defined as the resonance frequency divided by the resonance width) of the band-pass filter and the lower the noise of the amplifier, the lower the oscillator Phase Noise will be. In an integrated circuit (IC) there are many oscillator topologies possible, however in general the highest-Q topologies use an Inductor-Capacitor (LC) tank network as the band-pass filter, and in general most integrated LC oscillators are limited to Q factors of 20 or so.

In comparison, Quartz Crystal oscillators can have Q factors greater than 10000, however they are impossible to fabricate using standard IC technologies. Crystal oscillators can be packaged with standard ICs, but they require specialized packaging techniques including hermetic sealing. In addition, Quartz Crystal oscillator frequencies are comparatively low (10-100 MHz), and require comparatively large multiplication factors to use for many modern RF systems. Surface Acoustic Wave (SAW) devices (Q factors of 1000 or more) have been used as resonators in oscillators, however they are physically large and also require specialized packaging and as a result are comparatively expensive. Micro Electrical-Mechanical Systems (MEMS) based resonators (Q factors of 1000 or more) are readily fabricated with standard IC processing and are relatively inexpensive; however they have comparatively low oscillation frequencies (10-100 MHz). Bulk Acoustic Wave (BAW) devices are qualitatively similar to MEMS, have Q factors of 500 or more, are relatively easily packaged together with standard IC devices, are relatively inexpensive, and operate at high frequencies, 0.5-3 GHz. Because of their relatively high Q factors and low Phase Noise, relative inexpensiveness, and potential for integration with standard IC fabrication and packaging technology, both MEMS and BAW devices are potentially attractive for applications in integrated RF LO clock generation. However, because of their manufacturing tolerances, both have significant part-to-part center frequency variation and additionally have significant temperature variation which must be taken into account. Finally, neither is tunable over the range of frequencies required for a modern multi-carrier RF system.

Integer-N PLL technology is capable of producing low Phase Noise at its output, provided it has either a low-Phase Noise Reference and a high PLL bandwidth or a low Phase Noise VCO and a low PLL bandwidth. To have a flexible output (controllable frequency output over a pre-determined frequency range), it requires either an extremely low frequency input and a high multiplication factor or a flexible frequency input. Taken together, these characteristics make it a poor fit on its own to creating an integrated Low Phase Noise LO clock source for a modern multi-carrier RF system.

Fractional-N PLL technology can provide extremely good frequency flexibility and can operate from relatively high frequency reference clocks, but normally requires relatively low PLL bandwidths in order to attenuate the Fractional-N Modulator noise from the output, which in turn requires either a high Postscaler divider ratio or a low Phase Noise VCO in order to produce low Phase Noise output. The low PLL bandwidth is compatible with the reference clock characteristics, however the high Postscaler divider ratio is often incompatible with the required LO frequency. As a result, a Fractional-N PLL taken on its own is also a poor fit to creating an integrated Low Noise LO clock source.

Therefore, improvements in low noise LO clock signal sources are desirable.

BRIEF DESCRIPTION OF THE DRAWINGS

Embodiments of the present disclosure will now be described, by way of example only, with reference to the attached Figures.

FIG. 8 illustrates a Frequency Translation Mixer according to an embodiment of the present disclosure.

FIG. 9A illustrates a Frequency Translation Mixer Frequency Plan, with two pure tones and associated noise sidebands, prior to mixing the signals and noise bands, according to an embodiment of the present disclosure.

FIG. 9B illustrates a sum term and a difference term resulting from mixing the pure tones and noise side bands of FIG. 9A.

DETAILED DESCRIPTION

Figure 1:
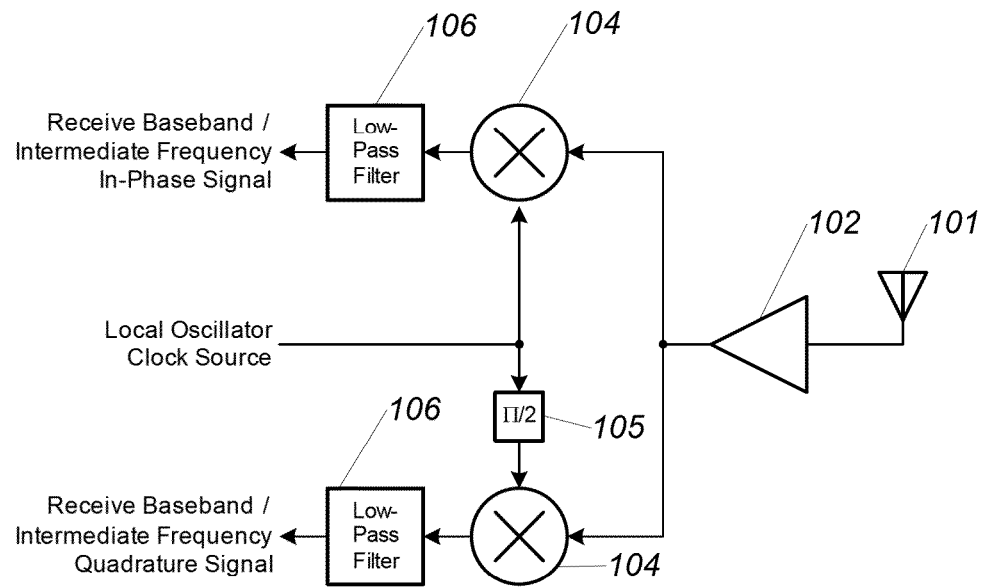
FIG. 1 illustrates a known Quadrature RF Receiver.
Figure 2:
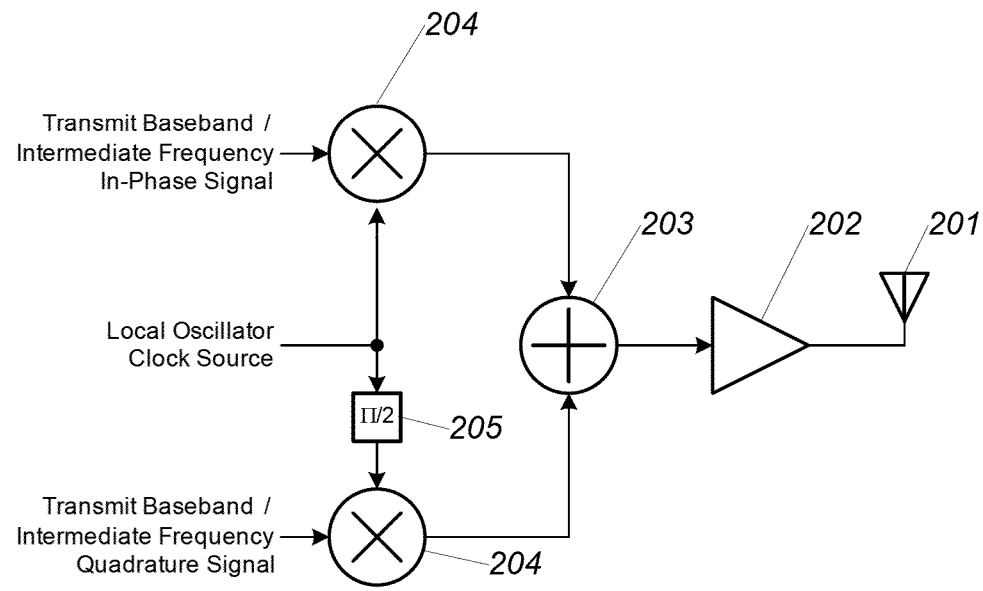
FIG. 2 illustrates a known Quadrature RF Transmitter.
Figure 3A:
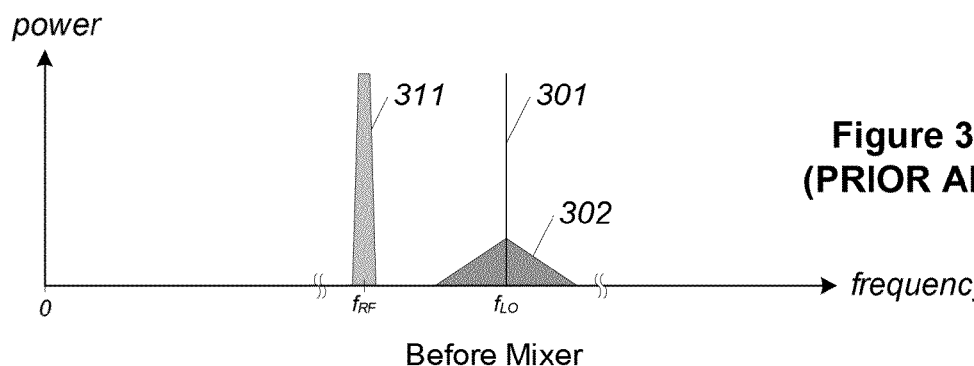
FIG. 3A illustrates a known Single-Frequency Receive RF System Frequency Plan prior to signals being mixed.
Figure 3B:
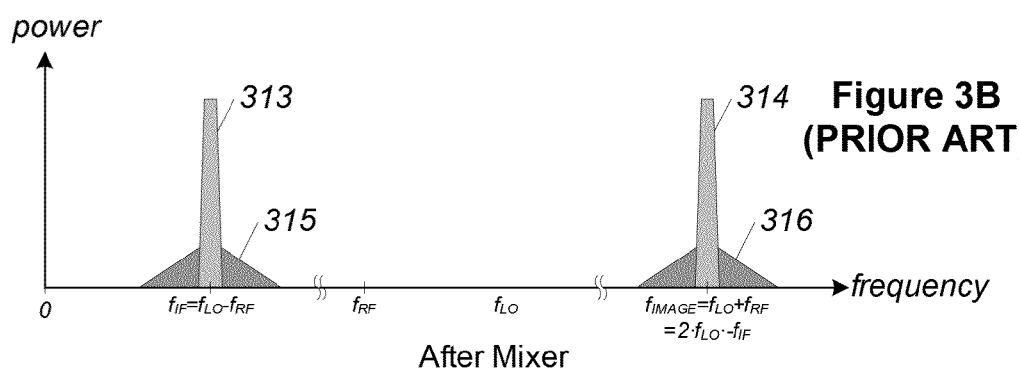
FIG. 3B illustrates the Single-Frequency Receive RF System Frequency Plan of FIG. 3A after mixing the signals of FIG. 3A.
Figure 4A:
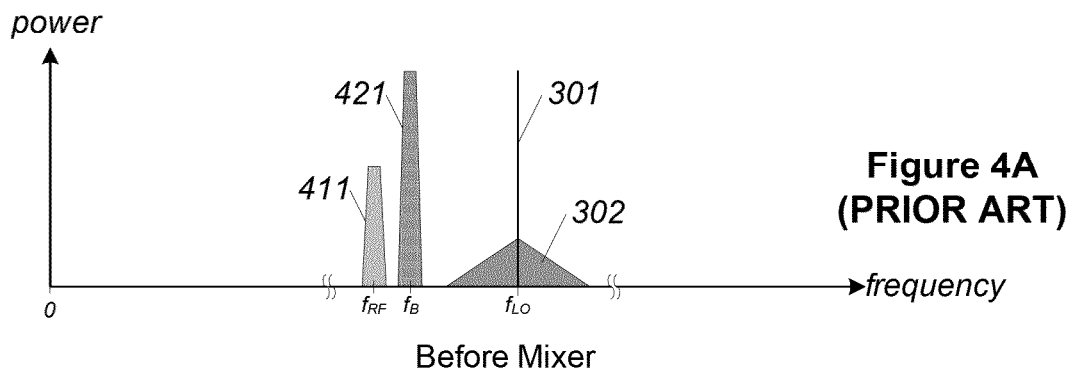
FIG. 4A illustrates a known Multi-Carrier Receive RF System Frequency Plan prior to signals being mixed.
Figure 4B:
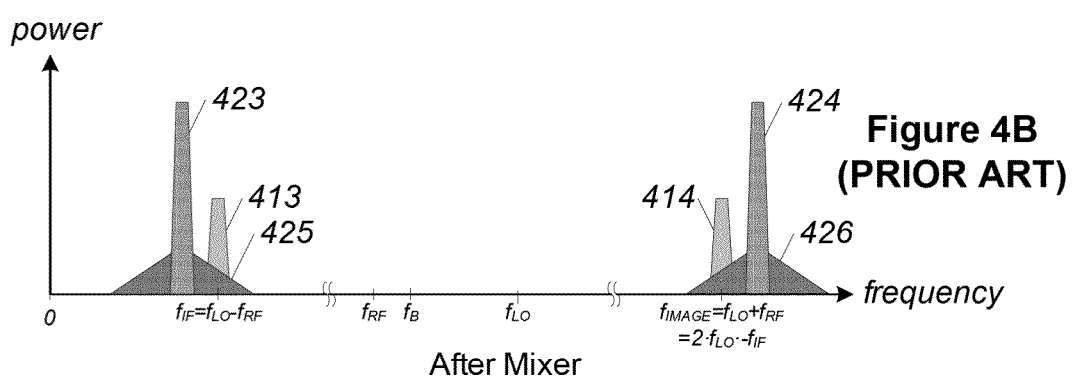
FIG. 4B illustrates the Multi-Carrier RF System Frequency Plan of FIG. 4A after mixing the signals of FIG. 4A.
Figure 5:
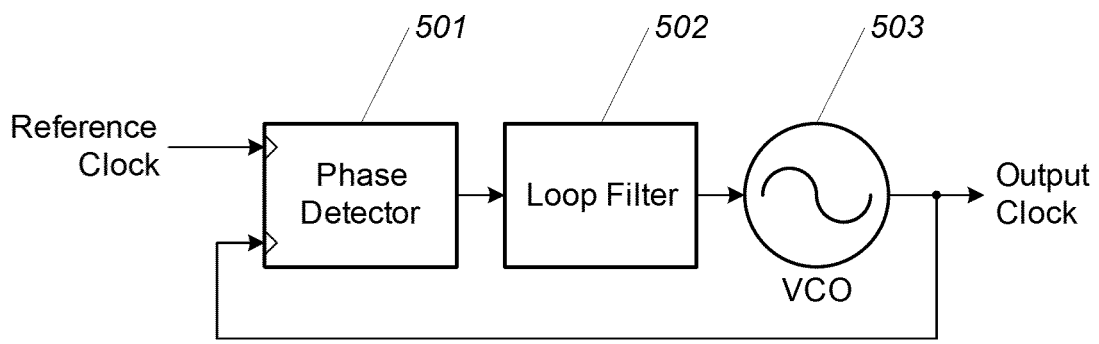
FIG. 5 illustrates a known Elementary Phase Locked Loop.

The present disclosure provides a low Phase Noise LO clock generator that uses Integer-N and Fractional-N PLLs in combination with a mixer that combines a high Phase Noise clock signal with a low Phase Noise clock signal. The high Phase Noise clock signal can be a network clock signal and the low Phase Noise clock signal can be that of, for example, a MEMS clock source or a BAW resonator clock source. The low Phase Noise clock source (e.g., the MEMS clock source or the BAW resonator clock source) can be integrated with the Integer-N and Fractional-N PLLs. The LO clock generators in accordance with the present disclosure are highly integrated, relatively inexpensive, and produce low Phase Noise LO clocks suitable for use in modern multi-carrier RF systems.

Embodiments of LO clock generators described in the present disclosure provide integrated low Phase Noise LO Clock generators for use in modern multi-carrier RF systems. The LO clocks (clock signals) need to be of sufficient quality for use in GSM applications, allow for multiple carriers covering frequencies up to 100 MHz, cover applications requiring LO clocks from approximate 700 MHz to 2 GHz, and provide frequency resolution of approximately 100 kHz.

In order to accomplish this, embodiments of the present disclosure use two reference clocks. The first, used as a frequency reference, has relatively high Phase Noise and can be provided by a recovered clock from a network but is frequency accurate. The second, used as a Phase Noise reference, has very good Phase Noise and can be generated by, for example, a high-Q local MEMS or BAW based resonator, but can have relatively poor frequency accuracy due to temperature effects on the resonator and due to resonator manufacturing tolerances. In addition to the two reference clocks, at least one Integer-N PLL is used to generate the final output clock, a mixer is used to combine the two reference clocks, and at least one Fractional-N PLL is added to allow for fine tuning of the overall system.

In the context of the present disclosure, elements can be said to be operationally connected to each other when, for example, a signal present in one element can be communicated to another element. Further, elements can be said to be operationally connected when an action in, or state of, one element can be controlled by, or related to, an action in, or a state of, another element.

In a first aspect of the present disclosure, there is provided a clock generator unit to generate a target clock signal having a target frequency. The clock generator unit comprises: a Fractional-N phase-locked loop (FNPLL) circuit having first phase detector circuitry and first voltage-controlled oscillator (VCO) circuitry operationally connected to the first phase detector circuitry, the first phase detector circuitry having a FNPLL reference input terminal and a FNPLL feedback input terminal, the FNPLL reference input terminal to receive a first clock signal, the first clock signal having associated thereto first clock signal Phase Noise, the FNPLL circuit being configured to have a FNPLL bandwidth that filters out the first clock signal Phase Noise and to generate an intermediate clock signal that is substantially free of the first clock signal Phase Noise; an Integer-N PLL (INPLL) circuit having second phase detector circuitry and second VCO circuitry operationally connected to the second phase detector circuitry, the second phase detector circuitry having an INPLL reference input terminal and an INPLL feedback input terminal, the INPLL reference input terminal to receive the intermediate clock signal, the second VCO circuitry to output the target clock signal, the INPLL circuit being configured to have an INPLL bandwidth that filters out Phase Noise generated by the second VCO circuitry; mixer circuitry to output a mixer output signal; and filter circuitry to filter the mixer output signal. The mixer circuitry and the filter circuitry are formed in the FNPLL or in the INPLL. When the mixer circuitry and the filter circuitry are formed in the FNPLL circuit, the mixer circuitry to receive a second clock signal and an output signal from the first VCO circuitry, the second clock signal being unrelated to the first clock signal, the mixer circuitry to generate a sum signal and a difference signal, the sum signal being at a sum frequency that is a function of a sum of the frequency of the first clock signal and the frequency of the output signal of the first VCO circuitry, the difference signal being at a difference frequency that is a function a difference between the frequency of the first clock signal and the frequency of the output signal of the first VCO circuitry, the filter circuitry to receive the sum signal and the difference signal and to generate a filtered signal that includes the sum signal, the intermediate signal being a function of the sum signal, the FNPLL feedback input terminal configured to receive a FNPLL feedback signal that is a function of a frequency and phase of the sum signal, the INPLL feedback input terminal configured to receive an INPLL feedback signal that is a function of the target signal. When the mixer circuitry and the filter circuitry are formed in the INPLL circuit, the mixer circuitry to receive a second clock signal and an output signal from the second VCO circuitry, the second clock signal being unrelated to the first clock signal, the mixer circuitry to generate a sum signal and a difference signal, the sum signal being at a sum frequency that is a function of a sum of the frequency of the first clock signal and the frequency of the output signal of the second VCO circuitry, the difference signal being at a difference frequency that is a function of a difference between the frequency of the first clock signal and the frequency of the output signal of the second VCO circuitry, the filter circuitry to receive the sum signal and the difference signal and to produce a filtered signal that includes the difference signal, the INPLL feedback input terminal configured to receive an INPLL feedback signal that is a function of the difference signal, the FNPLL feedback input terminal configured to receive a feedback signal that is a function of at least an output signal of the second VCO circuitry.

In a further aspect, the present disclosure provides clock generator unit to generate a target clock signal having a target frequency. The clock generator unit comprises: a first Fractional-N phase-locked loop (FFNPLL) circuit having first phase detector circuitry, first voltage-controlled oscillator (VCO) circuitry and first Fractional-N divider circuitry, the first phase detector circuitry being operationally connected to the first VCO circuitry, the first phase detector circuitry having a FFNPLL reference input terminal and a FFNPLL feedback input terminal, the FFNPLL reference input terminal to receive a first clock signal, the first clock signal having associated thereto first clock signal Phase Noise, the FNPLL circuit being configured to have a FNPLL bandwidth that filters out the first clock signal Phase Noise, the FFNPLL to generate an intermediate clock signal in accordance with the first clock signal and in accordance with a FFNPLL feedback signal received at the FFNPLL reference input terminal, the FFNPLL feedback signal being a function of an output from the first VCO circuitry, the intermediate clock signal being substantially free of the first clock signal Phase Noise; an Integer-N PLL (INPLL) circuit having: second phase detector circuitry; second VCO circuitry operationally connected to the second phase detector circuitry, the second phase detector circuitry having an INPLL reference input terminal and an INPLL feedback input terminal, the INPLL reference input terminal to receive the intermediate clock signal; mixer circuitry; and filter circuitry, the mixer circuitry to receive a second clock signal and an output signal from the second VCO circuitry, the second clock signal being unrelated to the first clock signal, the mixer circuitry to generate a sum signal and a difference signal, the sum signal being at a sum frequency that is a function of a sum of the frequency of the first clock signal and the frequency of the output signal of the second VCO circuitry, the difference signal being at a difference frequency that is a function of a difference between the frequency of the first clock signal and the frequency of the output signal of the second VCO circuitry, the filter circuitry to receive the sum signal and the difference signal and to produce a filtered signal that includes the difference signal, the INPLL feedback input terminal configured to receive an INPLL feedback signal that is a function of the filtered signal, the second VCO circuitry to output the target clock signal in accordance with the intermediate signal and in accordance with the INPLL feedback signal; and a second Fractional-N phase-locked loop (SFNPLL) circuit having third phase detector circuitry and second Fractional-N divider circuitry, the third phase detector circuitry having a SFNPLL reference input terminal and a SFNPLL feedback input terminal, the SFNPLL reference input terminal to receive the first clock signal, the second Fractional-N divider circuitry to receive the output signal from the second VCO circuitry and to generate an additional feedback signal as a function of settings of the SFNPLL, the SFNPLL feedback input terminal to receive the additional feedback signal, the third phase detector circuitry to output a control signal that is a function of the first clock signal and of the additional feedback signal, the first Fractional-N divider circuitry to receive the control signal, the FFNPLL feedback signal also being a function of the control signal.

In a further aspect, the present disclosure provides a clock generator unit to generate a target clock signal having a target frequency. The clock generator unit comprises: a first Fractional-N phase-locked loop (FFNPLL) circuit having first phase detector circuitry, first voltage-controlled oscillator (VCO) circuitry and first Fractional-N divider circuitry, the first phase detector circuitry being operationally connected to the first VCO circuitry, the first phase detector circuitry having a FFNPLL reference input terminal and a FFNPLL feedback input terminal, the FFNPLL reference input terminal to receive a first clock signal, the first clock signal having associated thereto first clock signal Phase Noise, the FNPLL circuit being configured to have a FNPLL bandwidth that filters out the first clock signal Phase Noise, the FFNPLL to generate an intermediate clock signal in accordance with the first clock signal and in accordance with a FFNPLL feedback signal received at the FFNPLL reference input terminal, the FFNPLL feedback signal being a function of an output from the first VCO circuitry, the intermediate clock signal being substantially free of the first clock signal Phase Noise; an Integer-N PLL (INPLL) circuit having: second phase detector circuitry; second VCO circuitry operationally connected to the second phase detector circuitry, the second phase detector circuitry having an INPLL reference input terminal and an INPLL feedback input terminal, the INPLL reference input terminal to receive the intermediate clock signal; mixer circuitry; and filter circuitry, the mixer circuitry to receive a second clock signal and an output signal from the second VCO circuitry, the second clock signal being unrelated to the first clock signal, the mixer circuitry to generate a sum signal and a difference signal, the sum signal being at a sum frequency that is a function of a sum of the frequency of the first clock signal and the frequency of the output signal of the second VCO circuitry, the difference signal being at a difference frequency that is a function of a difference between the frequency of the first clock signal and the frequency of the output signal of the second VCO circuitry, the filter circuitry to receive the sum signal and the difference signal and to produce a filtered signal that includes the difference signal, the INPLL feedback input terminal configured to receive an INPLL feedback signal that is a function of the filtered signal, the second VCO circuitry to output the target clock signal in accordance with the intermediate signal and in accordance with the INPLL feedback signal; and a second Fractional-N phase-locked loop (SFNPLL) circuit having third phase detector circuitry and second Fractional-N divider circuitry, the third phase detector circuitry having a SFNPLL reference input terminal and a SFNPLL feedback input terminal, the SFNPLL reference input terminal to receive the FFNPLL feedback signal, the second Fractional-N divider circuitry to receive the output signal from the second VCO circuitry and to generate an additional feedback signal as a function of settings of the SFNPLL, the SFNPLL feedback input terminal to receive the additional feedback signal, the third phase detector circuitry to output a control signal that is a function of the first clock signal and of the additional feedback signal, the first Fractional-N divider circuitry to receive the control signal, the FFNPLL feedback signal also being a function of the control signal.

In a further aspect, the present disclosure provides a clock generator unit to generate a target clock signal having a target frequency. The clock generator unit comprises: a Fractional-N phase-locked loop (FNPLL) circuit having phase detector circuitry and first voltage-controlled oscillator (VCO) circuitry operationally connected to the first phase detector circuitry, the first phase detector circuitry having a reference input terminal and a feedback input terminal, the reference input terminal to receive a first clock signal, the feedback input terminal to receive a feedback signal, the first clock signal having associated thereto first clock signal Phase Noise, the FNPLL circuit being configured to have a FNPLL bandwidth that filters out the first clock signal Phase Noise and to generate an intermediate clock signal that is substantially free of the first clock signal Phase Noise, the intermediate clock signal being a function of the first clock signal and of the feedback signal; an Integer-N PLL (INPLL) circuit having a triple-input mixer circuitry, filter circuitry and second VCO circuitry operationally connected to the mixer circuitry, the mixer circuitry to receive the intermediate signal, a second clock signal and an output signal from the second VCO circuitry, the second clock signal being unrelated to the first clock signal, the filter circuitry to receive an output from the mixer circuitry and to provide a filtered output signal to the second VCO, the second VCO circuitry to output the target clock signal, the feedback signal being a function of the target clock signal.

In a further aspect, the present disclosure provides a clock generator unit to generate a target clock signal having a target frequency, the clock generator unit comprises: a first Fractional-N phase-locked loop (FFNPLL) circuit having first phase detector circuitry, first voltage-controlled oscillator (VCO) circuitry and first Fractional-N divider circuitry, the first phase detector circuitry being operationally connected to the first VCO circuitry, the first phase detector circuitry having a FFNPLL reference input terminal and a FFNPLL feedback input terminal, the FFNPLL reference input terminal to receive a first clock signal, the first clock signal having associated thereto first clock signal Phase Noise, the FNPLL circuit being configured to have a FNPLL bandwidth that filters out the first clock signal Phase Noise, the FFNPLL to generate an intermediate clock signal in accordance with the first clock signal and in accordance with a FFNPLL feedback signal received at the FFNPLL feedback input terminal, the FFNPLL feedback signal being a function of an output from the first VCO circuitry, the intermediate clock signal being substantially free of the first clock signal Phase Noise; an Integer-N PLL (INPLL) circuit having a triple-input mixer circuitry, filter circuitry and second VCO circuitry operationally connected to the mixer circuitry, the mixer circuitry to receive the intermediate signal, a second clock signal and an output signal from the second VCO circuitry, the second clock signal being unrelated to the first clock signal, the filter circuitry to receive an output from the mixer circuitry and to provide a filtered output signal to the second VCO, the second VCO circuitry to output the target clock signal; and a second Fractional-N phase-locked loop (SFNPLL) circuit having second phase detector circuitry and second Fractional-N divider circuitry, the third phase detector circuitry having a SFNPLL reference input terminal and a SFNPLL feedback input terminal, the SFNPLL reference input terminal to receive the first clock signal, the second Fractional-N divider circuitry to receive the output signal from the second VCO circuitry and to generate an additional feedback signal as a function of settings of the SFNPLL, the SFNPLL feedback input terminal to receive the additional feedback signal, the second phase detector circuitry to output a control signal that is a function of the first clock signal and of the additional feedback signal, the first Fractional-N divider circuitry to receive the control signal, the FFNPLL feedback signal also being a function of the control signal.

In yet another aspect, the present disclosure provides a clock generator unit to generate a target clock signal having a target frequency, the clock generator unit comprises: a first Fractional-N phase-locked loop (FFNPLL) circuit having first phase detector circuitry, first voltage-controlled oscillator (VCO) circuitry and first Fractional-N divider circuitry, the first phase detector circuitry being operationally connected to the first VCO circuitry, the first phase detector circuitry having a FFNPLL reference input terminal and a FFNPLL feedback input terminal, the FFNPLL reference input terminal to receive a first clock signal, the first clock signal having associated thereto first clock signal Phase Noise, the FNPLL circuit being configured to have a FNPLL bandwidth that filters out the first clock signal Phase Noise, the FFNPLL to generate an intermediate clock signal in accordance with the first clock signal and in accordance with a FFNPLL feedback signal received at the FFNPLL reference input terminal, the FFNPLL feedback signal being a function of an output from the first VCO circuitry, the intermediate clock signal being substantially free of the first clock signal Phase Noise; an Integer-N PLL (INPLL) circuit having a triple-input mixer circuitry, filter circuitry and second VCO circuitry operationally connected to the mixer circuitry, the mixer circuitry to receive the intermediate signal, a second clock signal and an output signal from the second VCO circuitry, the second clock signal being unrelated to the first clock signal, the filter circuitry to receive an output from the mixer circuitry and to provide a filtered output signal to the second VCO, the second VCO circuitry to output the target clock signal; and an second Fractional-N phase-locked loop (SFNPLL) circuit having third phase detector circuitry and second Fractional-N divider circuitry, the third phase detector circuitry having a SFNPLL reference input terminal and a SFNPLL feedback input terminal, the SFNPLL reference input terminal to receive the FFNPLL feedback signal, the second Fractional-N divider circuitry to receive the output signal from the second VCO circuitry and to generate an additional feedback signal as a function of settings of the SFNPLL, the SFNPLL feedback input terminal to receive the additional feedback signal, the third phase detector circuitry to output a control signal that is a function of the first clock signal and of the additional feedback signal, the first Fractional-N divider circuitry to receive the control signal, the FFNPLL feedback signal also being a function of the control signal.

In yet another aspect, the present disclosure provides a method to generate a target clock signal. The method comprises: at a Fractional-N phase locked loop (FNPLL) circuit: receiving a first clock signal; receiving a second clock signal, the second clock signal being unrelated to the first clock signal; generating a modified clock signal as a function of the first clock signal and as a function of the second clock signal; with a mixer, combining the modified clock signal with the second clock signal to obtain a signal having a frequency sum component and a frequency difference component; and outputting an intermediate clock signal having a frequency that is a function of the frequency of the frequency sum component, the FNPLL having an FNPLL bandwidth selected to filter out Phase Noise present in the first clock signal. The method further comprises at Integer-N phase locked loop (INPLL) circuit: receiving the intermediate clock signal; and outputting the target clock signal as a function of the intermediate clock signal and as a function of a feedback signal, the INPLL circuit having an INPLL bandwidth selected to filter out Phase Noise generated by components of the INPLL circuit.

In another aspect, the present disclosure provides a method to generate a target clock signal, the method comprising: at a Fractional-N phase locked loop (FNPLL) circuit: receiving a first clock signal; and generating an intermediate clock signal as a function of the first clock signal and as a function of a first feedback signal, the FNPLL having an FNPLL bandwidth selected to filter out Phase Noise present in the first clock signal. The method further comprises, at an Integer-N phase locked loop (INPLL) circuit: receiving the intermediate clock signal; receiving a second clock signal, the second clock signal being unrelated to the first clock signal; with a mixer, combining the intermediate clock signal with the second clock signal to obtain a signal having a frequency sum component and a frequency difference component; and generating a second feedback clock signal that is a function of the frequency difference component; outputting the target clock signal as a function of the intermediate clock signal and as a function of the second feedback signal, the INPLL circuit having an INPLL bandwidth selected to filter out Phase Noise generated by components of the INPLL circuit.

In yet another aspect, the present disclosure provides a method to generate a target clock signal. The method comprises: at a Fractional-N phase locked loop (FNPLL) circuit: receiving a first clock signal; and generating an intermediate clock signal as a function of the first clock signal and as a function of a first feedback signal, the FNPLL having an FNPLL bandwidth selected to filter out Phase Noise present in the first clock signal. The method further comprises, at an Integer-N phase locked loop (INPLL) circuit: receiving the intermediate clock signal; receiving a second clock signal, the second clock signal being unrelated to the first clock signal; with a triple-input mixer, combining the intermediate clock signal with the second clock signal and with a second feedback signal received from voltage-controlled oscillator (VCO) circuitry of the INPLL circuit to obtain a signal having signal components at a plurality of frequencies, one of the plurality of frequencies being the closest to DC, one of the resulting signal components being at the frequency closest to DC; controlling the VCO circuitry as a function of the resulting signal at the frequency closest to DC; and outputting the target clock signal, the target signal being a function of the second feedback signal, the INPLL circuit having an INPLL bandwidth selected to filter out Phase Noise generated by components of the VCO circuitry.

Mixers as Frequency Translation Elements

At the core of embodiments of the present disclosure is the notion to use RF mixers to translate one frequency to another without dividers, thereby avoiding Phase Noise multiplication that would otherwise happen in a classic PLL. This approach is shown in FIG. 8, which shows an RF mixer 801 that combines two clocks, one a Frequency Reference and the other a Phase Noise Reference. The output from the mixer is fed through a filter 802 to remove unwanted images.

The frequency plan for such a mixer is shown in FIGS. 9A and 9B. FIG. 9A shows that the inputs to the mixer 801 are two pure tones 901 and 911, with their associated Phase Noise side-bands 902 and 912. As established by Equation 2 above and as shown at FIG. 9B, the output from the mixer 801 includes the sum term 921, the difference term 931, and their Phase Noise side-bands 922 and 932 respectively.

In general, outputs from the mixer will actually be the convolution (in the frequency domain) of the two input signals (including Phase Noise side-bands), however for practical clock signal power levels, the output Phase Noise side-bands 922 and 932 power levels can be taken as the sum of the input Phase Noise side bands 902 and 912 power levels, which simplifies analysis.

Using RF mixers for frequency translation is not a new concept, however prior art in this area has focused on fine frequency synthesis, using a mixer to combine a high-frequency coarsely-tuned clock signal with a low-frequency finely-spaced clock signal to create a high-frequency finely-spaced clock signal as an alternative to using a Fractional-N PLL. Embodiments of the present disclosure, however, focus on the Phase Noise implications of mixing, not on fine frequency tuning; a Fractional-N PLL provides that functionality. Mathematically, in accordance with the present disclosure, the mixer provides an addition or subtraction operation, which allows LO clock generator designers to choose circuit topologies to minimize Phase Noise gains from noisy frequency references.

With reference to FIGS. 8, 9A and 9B, for applications where the mixer operates as an Up-Conversion mixer, and the desired frequency output is the sum term 921, the filter 802 is a band-pass filter that passes the sum term and rejects the difference term 931. In this application, the Frequency Reference is a comparatively low frequency input compared to the Phase Noise Reference.

For applications where the mixer operates as a Down-Conversion mixer, and the desired frequency output is the difference term 931, the filter 802 is a low-pass filter that passes the difference term and rejects the sum term 921. In this application, the Frequency Reference is at a comparable frequency to the Phase Noise Reference, and is generated by a PLL with a comparatively wide bandwidth to attenuate Phase Noise generated by the PLL components.

Figure 6:
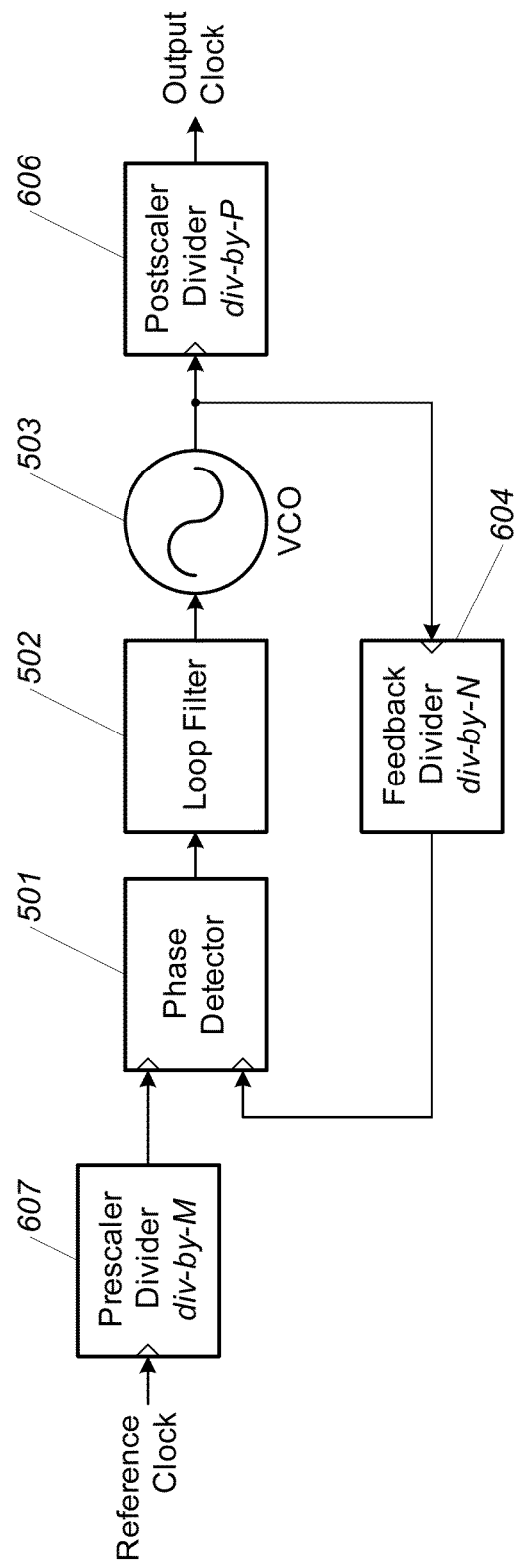
FIG. 6 illustrates a known Integer-N Phase Locked Loop.

As an example of an Up-Conversion mixer application, consider a situation where the LO system designer has a 100 MHz Frequency Reference, and requires a 2700 MHz Output Clock frequency. In a conventional Integer-N PLL (FIG. 6) the three dividers would be configured to provide a multiply-by-27 frequency operation from the Frequency Reference to the Output Clock (Equation 3). As a result the Phase Noise in the PLL bandwidth will also be multiplied by 27× (or shifted up by $20\times\log_{10}(27) \approx 29$ dBc/Hz). In order to limit the amount of Phase Noise present at the output due to the Frequency Reference, the PLL bandwidth must be made low, however in that case the Phase Noise from the VCO will dominate.

If the LO generator designer also has a 2600 MHz Phase Noise Reference (for example, a low Phase Noise BAW-based reference) and a mixer, he/she can mix the 100 MHz Frequency Reference with the 2600 MHz Phase Noise, producing 2500 MHz (the "difference") and 2700 MHz (the "sum") outputs. Using a filter to reject the 2500 MHz output leaves the desired 2700 MHz output. The frequency (and therefore phase) gain from the input to the output is 1, for a 27× reduction in Phase Noise at the output due to the Frequency Reference. However, the 2600 MHz Phase Noise reference will have frequency inaccuracies due to manufacturing tolerances and temperature effects and therefore, the mixer and filter will need to be embedded in a PLL to accurately track the Frequency Reference. In addition, the desired output frequency will not be as simple to produce as in this example, and a PLL (often a Fractional-N PLL) will be required in order to provide the required frequency.

Figure 7:
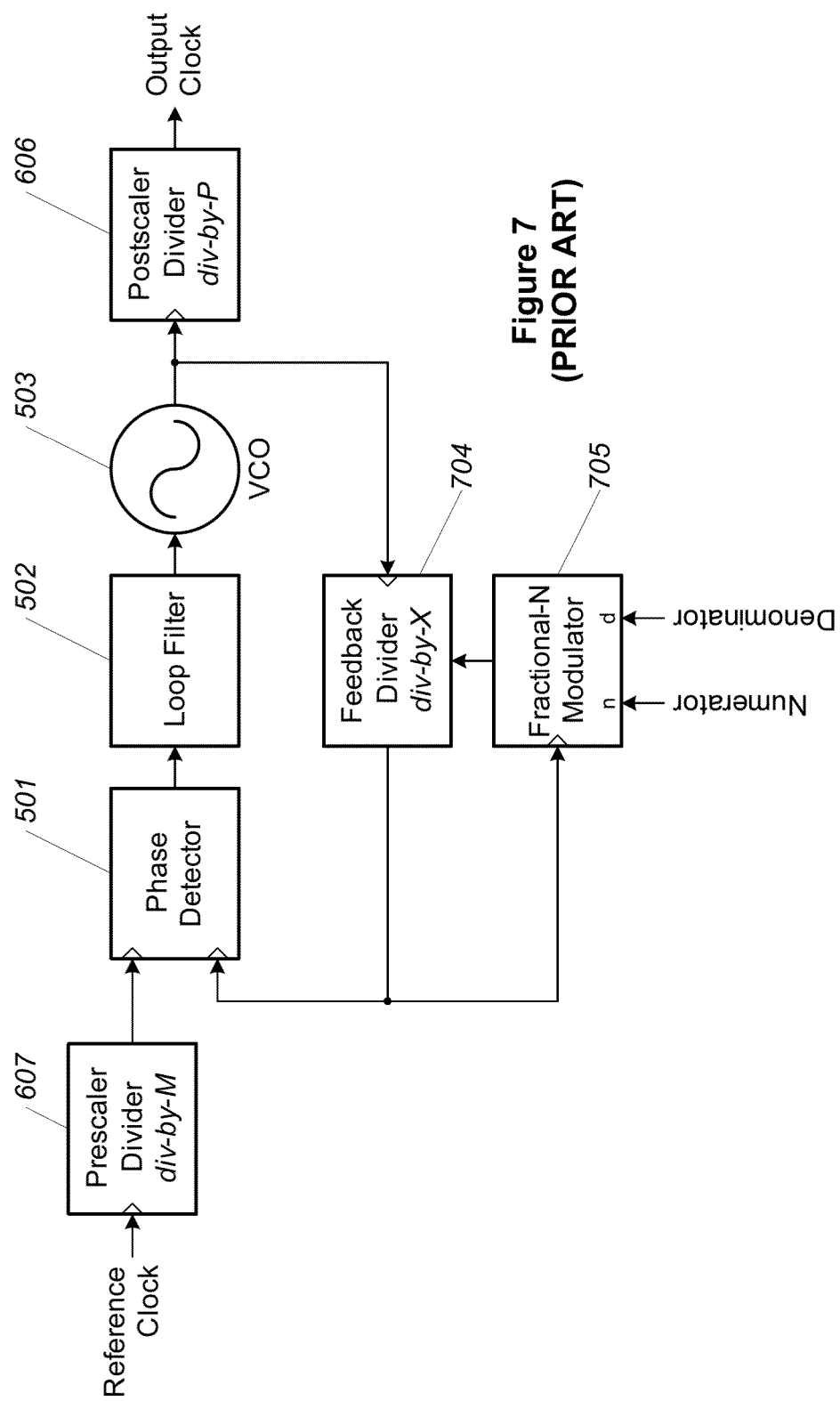
FIG. 7 illustrates a known Fractional-N PLL.
Figure 10:
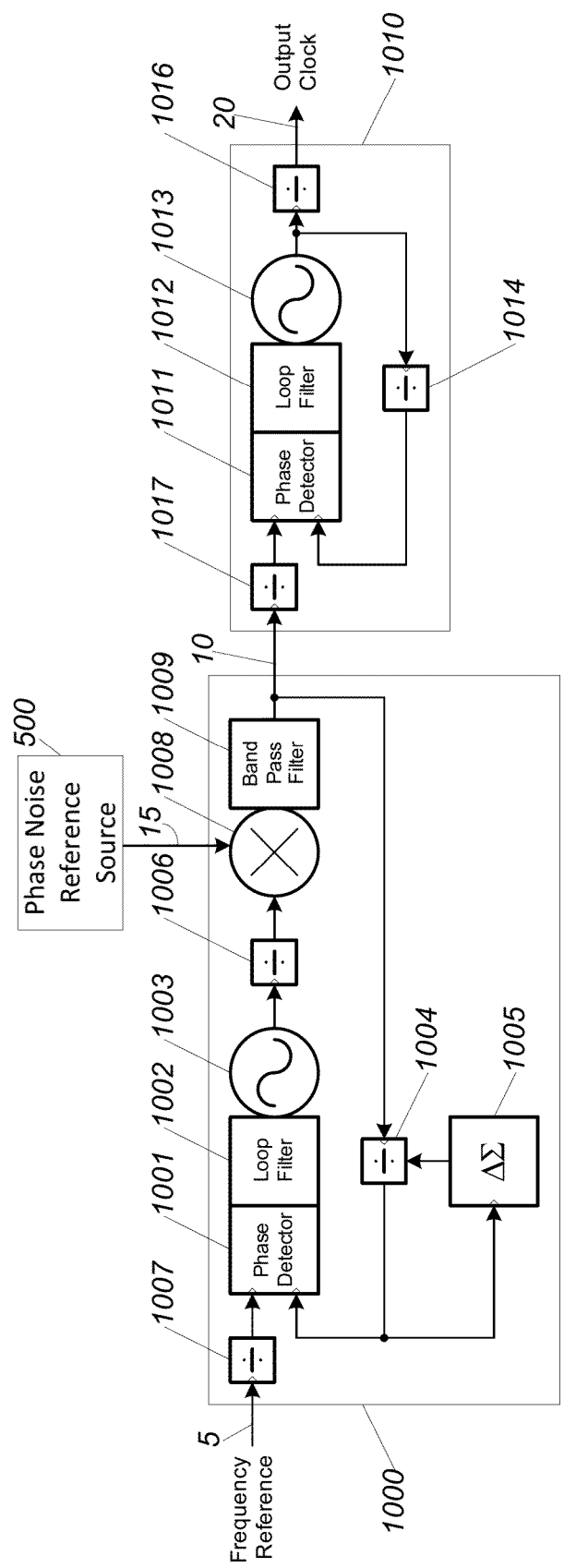
FIG. 10 illustrates a 2-PLL Cascaded Up-Conversion Based LO Clock Generator according to an embodiment of the present disclosure.

A First Embodiment of an Up-Conversion Based LO Clock Generator:

A first exemplary embodiment of an Up-Conversion based LO clock generator is shown in FIG. 10. The Up-Conversion based LO clock generator comprises a Fractional-N PLL 1000 cascaded with an Integer-N PLL 1010. The fractional-N PLL 1000 receives a frequency reference signal 5 and outputs an intermediate signal 10. The Fractional-N PLL differs from the one described in FIG. 7 in that a Mixer 1008 is introduced into the output path that mixes the output from the VCO 1003 with a low Phase Noise Reference signal 15 sourced from a Phase Noise Reference Source (generator) 500 (e.g., a MEMS resonator clock source, a BAW resonator clock source, a surface acoustic wave resonator clock source, a quartz clock source, etc.) The mixer 1008 operates in an Up-Conversion mode, and a band-pass filter 1009 (filter) is used to select the "sum" output from the mixer. The Fractional-N PLL 1000 is configured to produce a convenient reference frequency (of the intermediate signal 10) for the Integer-N PLL 1010, which in turn produces the desired output frequency (the output clock 20). The intermediate clock signal is substantially free of the first clock signal Phase Noise, which is to be understood as meaning at least that the signal to noise ratio of the intermediate clock signal is better than that of the first clock signal.

An additional divider 1006 (frequency divider) in the Fractional-N PLL 1000 is configured to produce a relatively large divide ratio, which acts to attenuate Phase Noise generated by the VCO 1003. A low Fractional-N PLL bandwidth attenuates Phase Noise from the Frequency Reference and from the Fractional-N divider 1004 and 1005, while a wide Integer-N PLL bandwidth will attenuate Phase Noise that comes from the Integer-N PLL VCO component.

The Fractional-N PLL 1000 can also be referred to as a fractional-N PLL circuit and the Integer-N PLL 1010 can also be referred to as an Integer-N PLL circuit. The phase detectors 1001 and 1011 can each be referred to as phase detector circuitry that may include a loop filter 1002 and 1012 respectively as well as a prescaler divider 1007 and 1017 respectively. Each of the phase detectors (each of the phase detector circuitries) has a reference input terminal and a feedback input terminal. The VCOs 1003 and 1013 can each be referred to as VCO circuitry that may include a postscaler divider (frequency divider) 1006 or 1016. The fractional-N divider 1005 and 1005 can be referred to as fractional-N divider circuitry. The filter (or band pass filter) 1009 can be referred to as filter circuitry. The phase detector 1001 receives a feedback signal that is a function of the sum signal generated at the output of the band bass filter 1009. In the present embodiment, the feedback signal received at the feedback input terminal of the phase detector 1001 is at a frequency that is equal to a rational fraction of the frequency of the sum signal. The feedback signal received at the feedback input terminal of the phase detector 1011 is a function of the target clock signal (output clock) output from the postscaler divider 1016. In the present embodiment, the feedback signal received at the phase detector 1011 is at a frequency equal to that of the target clock signal multiplied by the inverse of divide ratio of postscaler divider 1016, divided by the divide ratio of the divider 1014.

Figure 11:
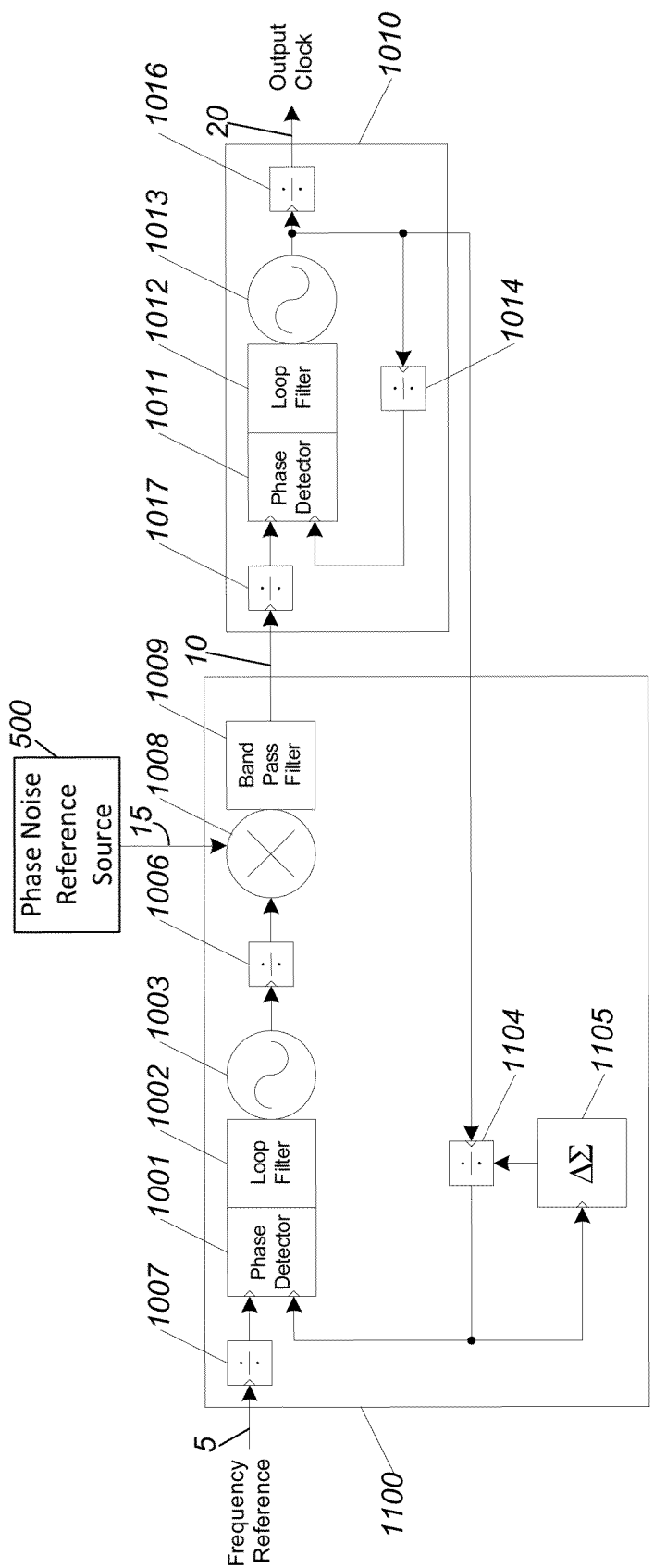
FIG. 11 illustrates a 2-PLL Nested Up-Conversion Based LO Clock Generator according to an embodiment of the present disclosure.

A Second Up-Conversion Based LO Clock Generator:

A second LO clock generator exemplary embodiment of the present disclosure is shown in FIG. 11. Similar to the generator shown in FIG. 10, the embodiment of FIG. 11 comprises a Fractional-N PLL 1100, a Phase Noise reference source 500 and an Integer-N PLL 1010, however in this configuration the two PLLs are nested, not cascaded. FIG. 11 also shows a frequency reference signal 5, an intermediate signal 10, a Phase Noise reference signal 15 and an output clock 20.

Nesting the PLLs, that is, embedding the Integer-N PLL (1010) inside the Fractional-N PLL, has similar properties to cascading them, with the major exception that the Fractional-N divider (1104/1105) is configured differently, taking its input from the VCO 1013 of the Integer-N PLL 1010 rather than from the filter or band pass filter 1009. Following classic control theory on nested feedback loops, so long as the Integer-N PLL's bandwidth is much greater than the Fractional-N PLL's bandwidth, the loop will be stable. The major advantage of this configuration over the cascaded alternative is that the final frequency selection is somewhat simplified because the output clock frequency is now dependent on 3 dividers, rather than 5.

Both LO Clock Generators of FIG. 10 and FIG. 11 provide a flexible LO clock out through the use of a Fractional-N divider. The Phase Noise of the Frequency Reference is passed through to the output with a multiplication factor set by the feedback dividers, filtered by the PLL bandwidth of the Fractional-N PLL. The VCO noise of the Fractional-N PLL is attenuated by a large divider above the Fractional-N PLL's bandwidth, and is summed with the low Phase Noise provided by the Phase Noise Reference. This sum is a low Phase Noise Reference for the Integer-N PLL, which has a wide PLL bandwidth to suppress its internal noise sources, and as a result the overall Phase Noise at the Output Clock remains relatively low noise.

The band-pass filter 1009 of the Up-Conversion based LO Clock Generators of FIG. 10 and FIG. 11 can be difficult to design. This is because in order to attenuate Phase Noise from the VCO 1003 the divider 1006 must be made relatively large, and therefore the frequency input to the mixer 1008 from the divider 1006 is relatively small, and the frequency spacing between the "sum" and "difference" outputs is also relatively small. This in turn requires that the band-pass filter 1009 have a relatively narrow pass-band, which in turn requires that the filter have a relatively high order and in turn requires either tight component tolerances or a method of tuning the filter against loose component tolerances. In addition, if the LO Clock Generator is required to be flexible and cover a wide range of frequencies, the filter must also be tunable to cover the extended frequency range.

The Fractional-N PLL 1100 can also be referred to as a fractional-N PLL circuit and the Integer-N PLL 1010 can also be referred to as an Integer-N PLL circuit. The phase detectors 1001 and 1011 can each be referred to as phase detector circuitry that may include a loop filter 1002 and 1012 respectively as well as a prescaler divider 1007 and 1017 respectively. Each of the phase detectors (each of the phase detector circuitries) has a reference input terminal and a feedback input terminal. The VCOs 1003 and 1013 can each be referred to as VCO circuitry that may include a postscaler divider (frequency divider) 1006 or 1016. The fractional-N divider 1005 and 1005 can be referred to as fractional-N divider circuitry. The filter (or band pass filter) 1009 can be referred to as filter circuitry. The phase detector 1001 receives a feedback signal that is a function of the sum signal generated at the output of the band bass filter 1009. In the present embodiment, the feedback signal received at the feedback input terminal of the phase detector 1001 is at a frequency that is equal to a rational fraction of the frequency of the sum signal. The feedback signal received at the feedback input terminal of the phase detector 1001 is a function of the target clock signal (output clock) output from the postscaler divider 1016. It is in fact a function of the frequency and phase of the target clock signal. In the present embodiment, the feedback signal received at the phase detector 1001 is at a frequency equal to that of the target clock signal multiplied by the inverse of divide ratio of postscaler divider 1016, divided by the divide ratio of the divider 1104. As the target clock signal depends from the sum signal provided by the fractional-N PLL 1100, the feedback signal provided to the phase detector 1001 is also a function of the sum signal. The feedback signal received at the phase detector 1001 is at a frequency equal to that of the target clock signal multiplied by the inverse of divide ratio of postscaler divider 1016, divided by the divide ratio of the divider 1014.

Figure 12:
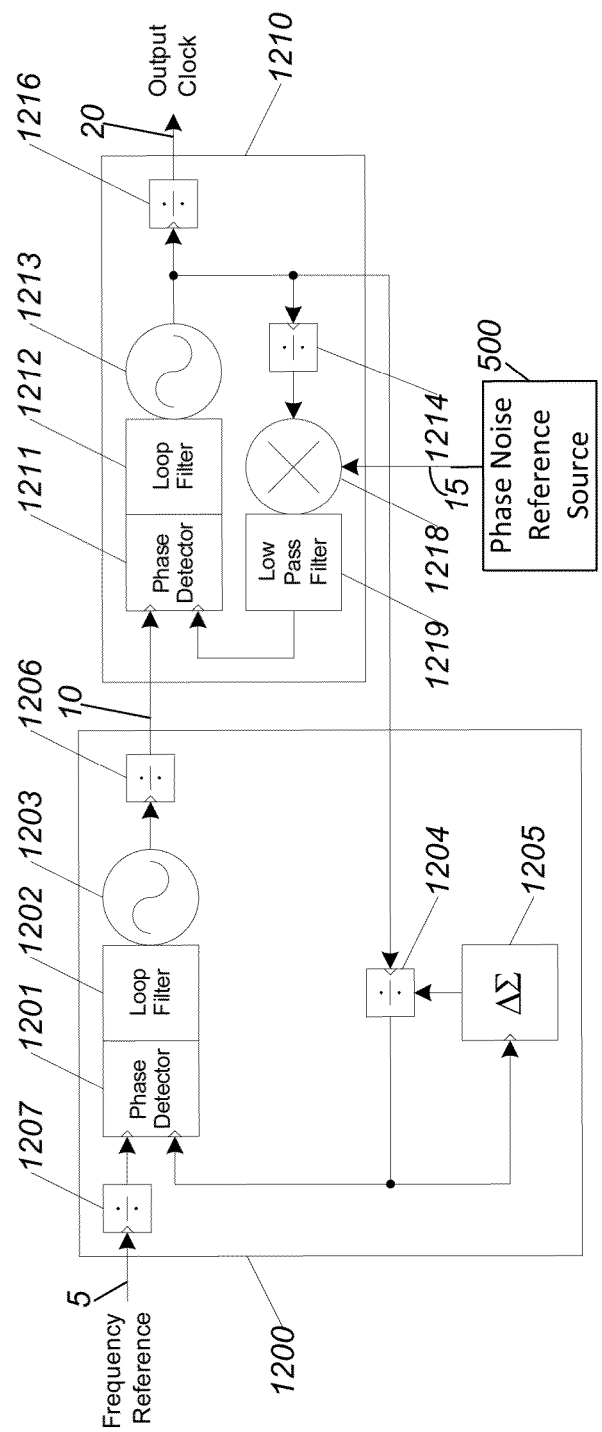
FIG. 12 illustrates a 2-PLL Nested Down-Conversion Based LO Clock Generator according to an embodiment of the present disclosure.

A First Down-Conversion Based LO Clock Generator:

An alternative embodiment, one that avoids the above-noted issue with the band-pass filter 1009 involves a Down-Conversion mixer. An LO clock generator that implements this approach is shown in FIG. 12. As in FIG. 10 and FIG. 11, the generator uses a Fractional-N PLL 1200, an Integer-N PLL 1210 and a Phase Noise reference source 500, and as in FIG. 11 the Integer-N PLL is nested inside the Fractional-N PLL. However in this configuration, the Phase Noise Reference and Mixer 1218 are inserted into the feedback path of the Integer-N PLL, and the filter 1219 that follows the mixer is a low-pass filter rather than a band-pass filter. FIG. 12 also shows a frequency reference signal 5, an intermediate signal 10, a Phase Noise reference signal 15 and an output clock 20.

As in FIG. 10 and FIG. 11 the output from the Fractional-N PLL VCO 1203 is divided by a large-value divider 1206, and then the Phase Noise Reference frequency is added, however because the mixer 1218 is placed in the Integer-N feedback path and is used as a Down-Conversion mixer, this addition is performed by subtracting the Phase Noise Reference frequency from a similar-frequency output from feedback divider 1214 resulting in a low frequency, rather than by addition of a low frequency to a high frequency as in the Up-Conversion designs.

Mathematically, the Output Clock from FIG. 12 is almost identical to that of FIG. 11, however the Down-Conversion operation (subtracting two high frequencies to produce a low frequency instead of adding a low frequency to a high frequency) means that there is a much wider frequency spacing between the sum and difference outputs from the mixer, which greatly simplifies the filter design, and furthermore allow the LO Clock Generator to use a simpler Low-Pass Filter instead of a Band-Pass Filter.

As in other embodiments, the Fractional-N PLL 1200 can also be referred to as a fractional-N PLL circuit and the Integer-N PLL 1210 can also be referred to as an Integer-N PLL circuit. The phase detectors 1201 and 1211 can each be referred to as phase detector circuitry that may include a loop filter 1202 and 1212 respectively as well as a prescaler divider such as, for example the prescaler divider 1207. Each of the phase detectors (each of the phase detector circuitries) has a reference input terminal and a feedback input terminal. The VCOs 1203 and 1213 can each be referred to as VCO circuitry that may include a postscaler divider (frequency divider) 1206 or 1216. The fractional-N divider 1205 and 1204 can also be referred to as fractional-N divider circuitry. The filter (or low pass filter) 1219 can be referred to as filter circuitry. The phase detector 1201 receives a feedback signal that is a function of the output clock (target clock signal). In the present embodiment, the feedback signal received at the feedback input terminal of the phase detector 1201 is at a frequency that is equal to a rational fraction of the frequency of the sum signal. The feedback signal received at the feedback input terminal of the phase detector 1201 is a function of the target clock signal (output clock) output from the VCO 1213. It is in fact a function of the frequency and phase of the target clock signal. In the present embodiment, the feedback signal received at the phase detector 1201 is at a frequency equal to that of the target clock signal multiplied by the inverse of divide ratio of postscaler divider 1216, divided by the divide ratio of the divider 1204. As the target clock signal depends from the intermediate signal provided by the fractional-N PLL 1200 to the Integer-N PLL 1210, the feedback signal provided to the phase detector 1201 is also a function of the intermediate signal. The feedback signal received at the phase detector 1201 is at a frequency equal to that of the target clock signal multiplied by the inverse of divide ratio of postscaler divider 1216, divided by the divide ratio of the divider 1204.

Figure 13:
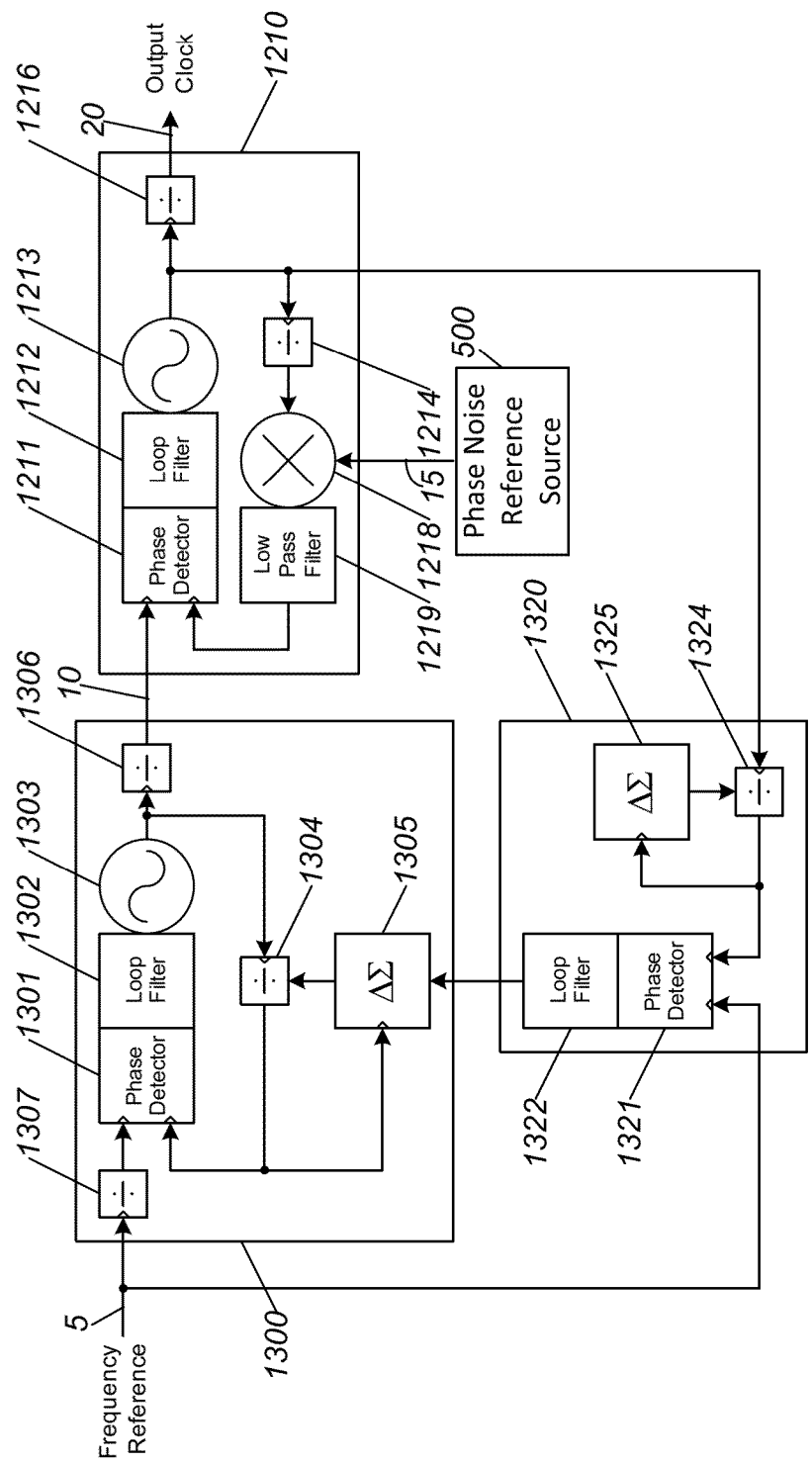
FIG. 13 illustrates a 3-PLL Nested Down-Conversion Based LO Clock Generator according to an embodiment of the present disclosure.

A Second Down-Conversion Based LO Clock Generator:

Another Down-Conversion mixer based LO clock generator embodiment, in accordance with the present disclosure is shown in FIG. 13 and comprises a Phase Noise reference source 500, a Fractional-N PLL 1300 cascaded with an Integer-N PLL 1210, plus a second Fractional-N PLL 1320 (i.e., a third PLL) with the other two PLLs nested inside of it. This second Fractional-N PLL 1320 controls the first fractional-N PLL 1300 by driving the Fractional-N modulator 1305 using techniques similar to those described in U.S. Pat. No. 7,986, 190 B1, and is therefore a fully-digital PLL with a fully-integrated digital loop filter 1322. FIG. 13 also shows a frequency reference signal 5, an intermediate signal 10, a Phase Noise reference signal 15 and an output clock 20.

The inclusion of this third PLL (1320) allows the system to have a much lower overall bandwidth than would otherwise be reasonable in an integrated system, and allows for a greater degree of modularity in choosing the various loop bandwidths: the first Fractional-N PLL 1300 can have a bandwidth chosen to optimize the output Phase Noise independent of the required bandwidth to filter the Phase Noise of the Frequency Reference, provided that its bandwidth is greater than the bandwidth of the second Fractional-N PLL 1320 and less than the bandwidth of the Integer-N PLL 1310. The second Fractional-N PLL 1320 with the digital loop filter 1322 may provide an extremely low loop bandwidth, rejecting the maximum amount of Phase Noise from the Frequency Reference as possible. Outside of the bandwidth of the second fractional-N PLL 1320, the embodiment of FIG. 13 performs identically to that in FIG. 12.

As in other embodiments, the Fractional-N PLL 1300 can also be referred to as a fractional-N PLL circuit and the Integer-N PLL 1210 can also be referred to as an Integer-N PLL circuit. The phase detectors 1301 and 1211 can each be referred to as phase detector circuitry that may include a loop filter 1302 and 1212 respectively as well as a prescaler divider such as, for example the prescaler divider 1307. Each of the phase detectors (each of the phase detector circuitries) has a reference input terminal and a feedback input terminal. The VCOs 1303 and 1213 can each be referred to as VCO circuitry that may include a postscaler divider (frequency divider) 1206 and 1216 respectively. The fractional-N divider 1305 and 1304 can also be referred to as fractional-N divider circuitry. The filter (or low pass filter) 1219 can be referred to as filter circuitry. The phase detector 1301 receives a feedback signal that is a function of the intermediate signal provided by the fractional-N PLL 1300 to the Integer-N PLL 1210. In the present embodiment, the feedback signal received at the feedback input terminal of the phase detector 1301 is at a frequency that is equal to that of the intermediate signal divided by the divide ratio of the frequency divider 1304. The feedback signal received at the feedback input terminal of the phase detector 1201 is a function of the target clock signal (output clock) output from the VCO 1213, and, it is also a function of the difference signal output from the low pass filter 1219.

Additional Embodiments and Design Optimizations:

There are many optimizations available in implementing embodiments of the present disclosure. One such optimization involves the Integer-N PLL 1210, of FIG. 12 and FIG. 13, and provides a simplified circuit shown in FIG. 14A. This simplified Integer-N PLL 1410 can be substituted in place of the Integer-N PLL 1210 of FIG. 12 and FIG. 13, and takes advantage of the fact that the PLL itself acts as a low-pass filter and the Low-Pass Filter 1219 of FIGS. 12 and 13 can be removed, and of the fact that the Phase Detector 1211 can be implemented with a mixer, meaning that both the original mixer 1218 and phase detector 1211 can be replaced with a triple-input mixer 1418, and the Low Pass filter 1219 can be removed. The Triple-Input-Mixer 1418 of FIG. 14A receives a Phase Noise reference signal 2000, a feedback input signal 2002 from the VCO 1413, through a frequency divider 1414, and an input signal 2004 from a fractional-N PLL circuit (not shown). The output from the Triple-Input-Mixer 1418 will have frequency components at each possible combination (both sum and difference) of the three frequencies of signals 2000, 2002 and 2004. One such frequency component will be equal to the sum of the frequency of the Phase Noise reference signal 2000 and the frequency of the input signal 2004 provided by the Fractional-N PLL, minus the frequency of the feedback input signal 2002. This frequency component will be at DC (0 Hz) when the Integer-N PLL 1410 is locked or, if not locked, will be driven to DC by the Integer-N PLL 1410. The low-pass response of the PLL, which includes the loop filter 1412, will tend to pass this desired near-DC frequency component, and will tend to attenuate all other undesirable frequency components.

Figure 14A:
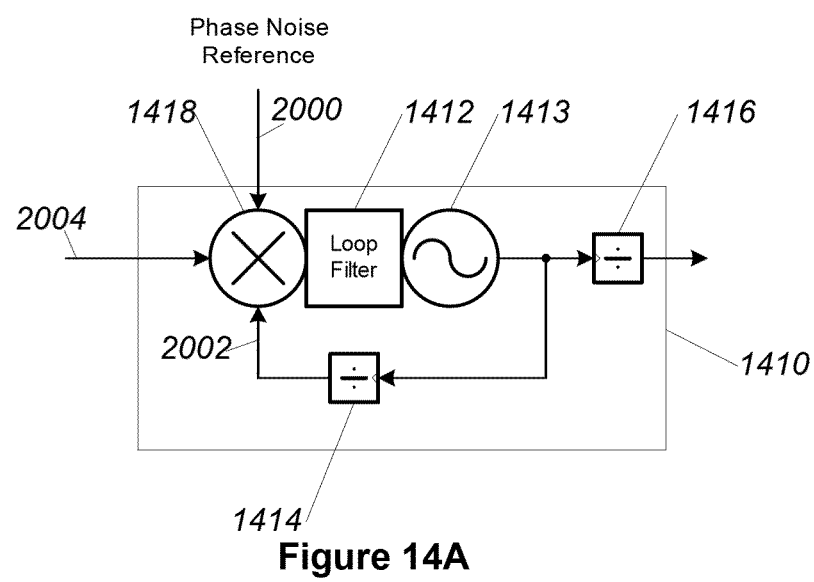
FIG. 14A illustrates a Triple-Input Mixer Integer-N PLL according to an embodiment of the present disclosure.
Figure 14B:
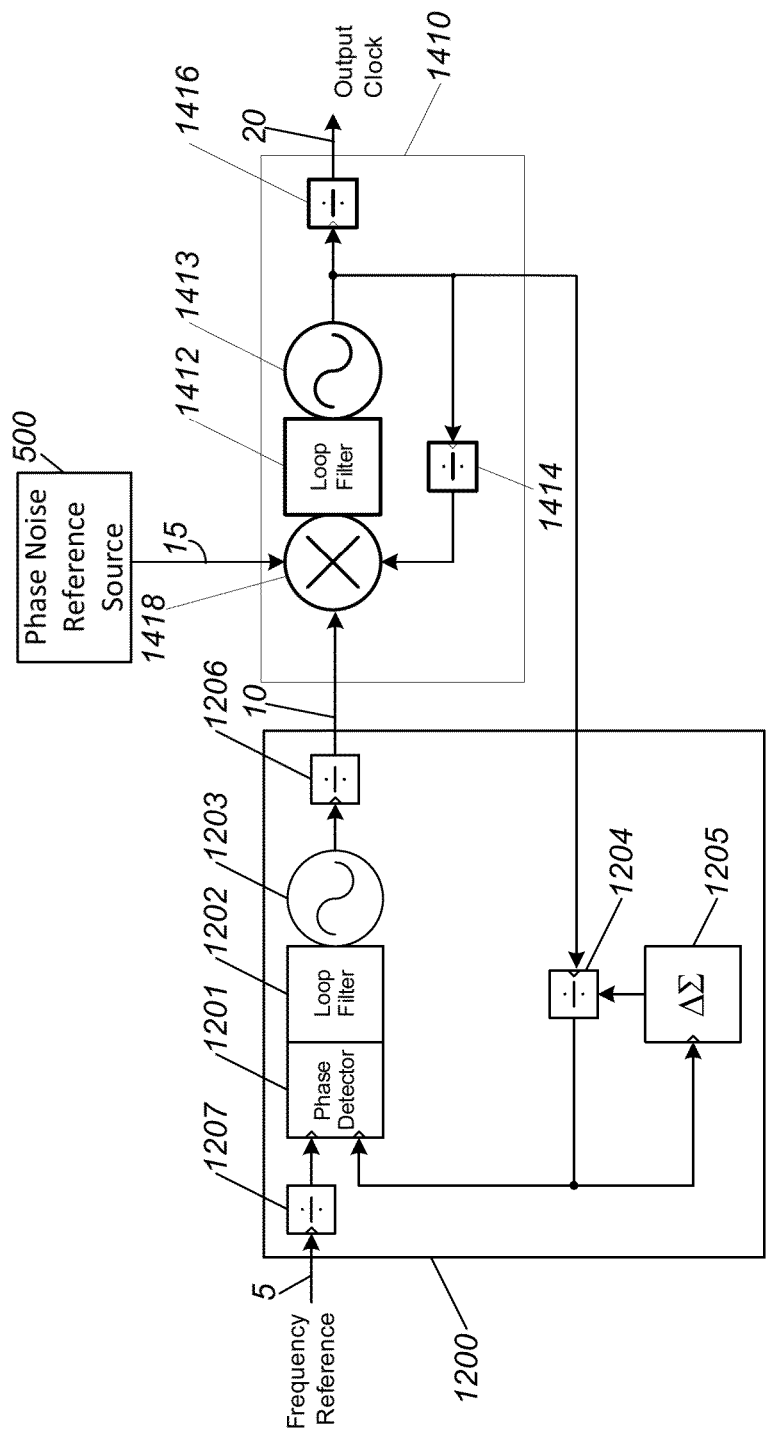
FIG. 14B illustrates the triple-input mixer integer N PLL of FIG. 14A integrated in a Nested Down-Conversion Based LO Clock Generator according to an embodiment of the present disclosure.
Figure 14C:
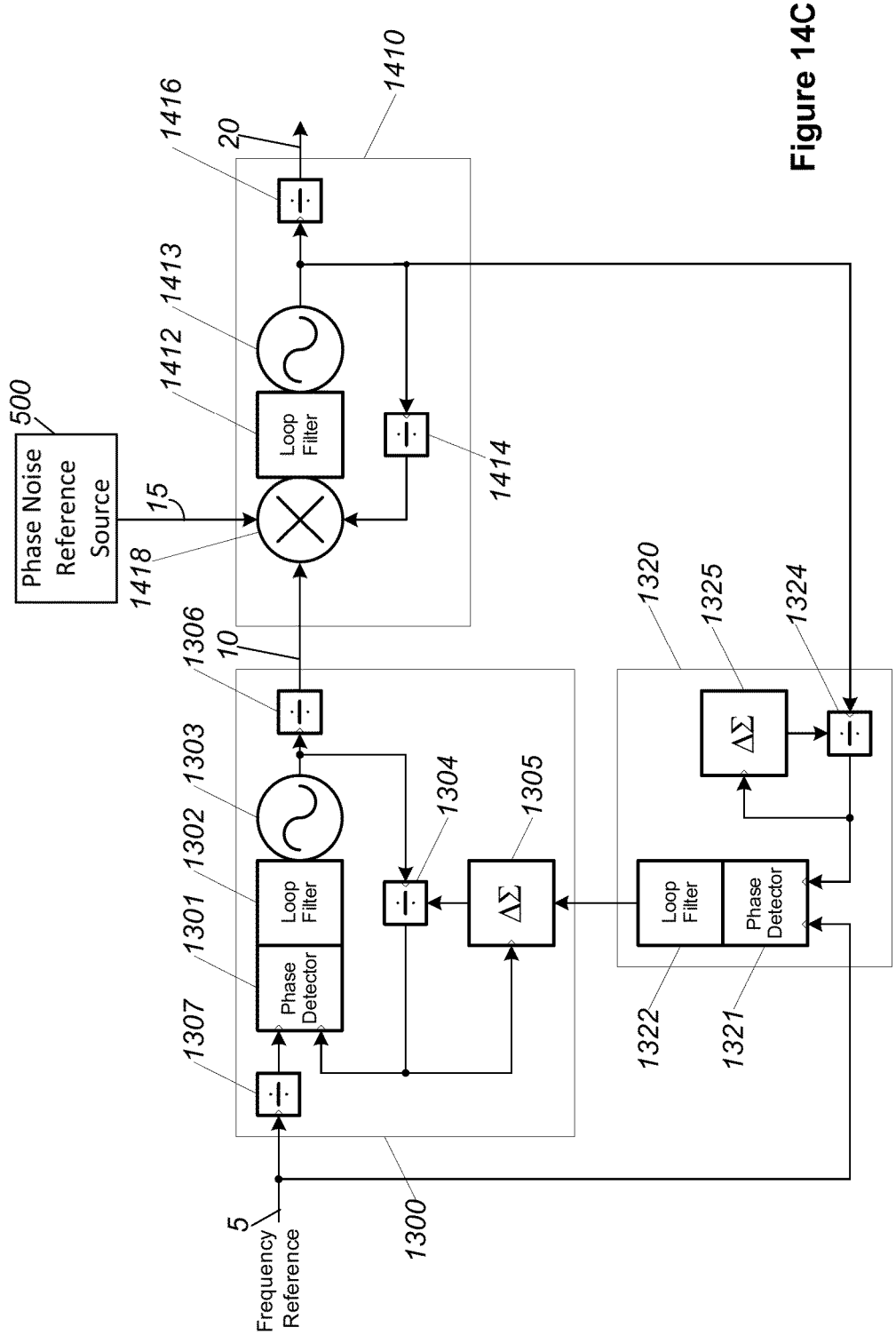
FIG. 14C illustrates the triple-input mixer integer N PLL of FIG. 14A integrated in a Nested Down-Conversion Based LO Clock Generator according to an embodiment of the present disclosure.

FIG. 14B shows how the embodiment of FIG. 12 can be modified in accordance with the Triple-Input Mixer Integer-N PLL of FIG. 14A. FIG. 14C shows how the embodiment of FIG. 13 can be modified in accordance with the Triple-Input Mixer Integer-N PLL of FIG. 14A. FIGS. 14B and 14C also show a frequency reference signal 5, an intermediate signal 10, a Phase Noise reference signal 15 and an output clock 20.

One limitation of this optimization is that a mixer-based Phase Detector is only capable of tracking frequencies over a limited range, and as a result will likely need to use a second phase detector (not shown), such as a Phase/Frequency Detector (PFD) during the initial lock.

Figure 15:
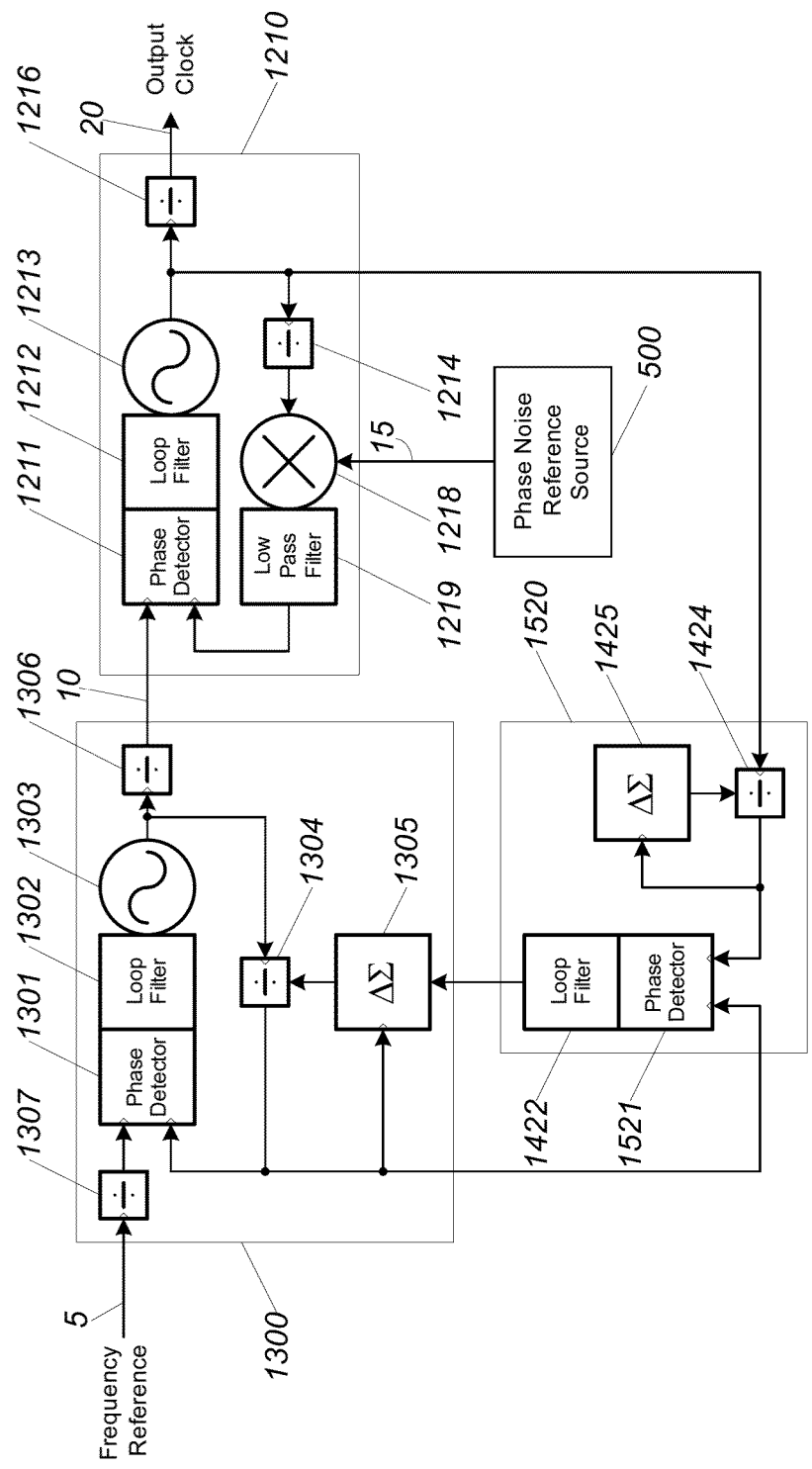
FIG. 15 illustrates a 3-PLL Nested Down-Conversion Based LO Clock Generator with Optimized Phase Detector Clocking according to an embodiment of the present disclosure.

Another optimization simplifies the clocking of the Phase Detector 1321 associated with the second Fractional-N PLL 1320 in FIG. 13, and is shown in FIG. 15. This optimization modifies this second Fractional-N PLL 1520 (FIG. 15), driving the reference input to the phase detector with the feedback clock from the first PLL rather than from the Frequency Reference.

Within the bandwidth of the first Fractional-N PLL 1300, this feedback clock tracks the Phase Noise of the Frequency Reference and, given the bandwidth of the first Fractional-N PLL, is greater than that of the second Fractional-N PLL 1520. The results are mathematically equivalent. This modification, however, significantly simplifies implementation of the system. Placing the Phase Detector 1521, Loop Filter 1422, and Fractional-N Modulator 1305 on the same clock domain, simplifies data hand-off from one block to the next. In an example embodiment, a preferred implementation of the Phase Detector 1521 uses a Time-to-Digital Converter (TDC) that is compatible with standard digital Synthesis and Place and Route implementation techniques that can be laid out together with the other parts of the system, thereby reducing the implementation cost substantially compared to the original design. FIG. 15 also shows a frequency reference signal 5, an intermediate signal 10, a Phase Noise reference signal 15 and an output clock 20.

Figure 16:
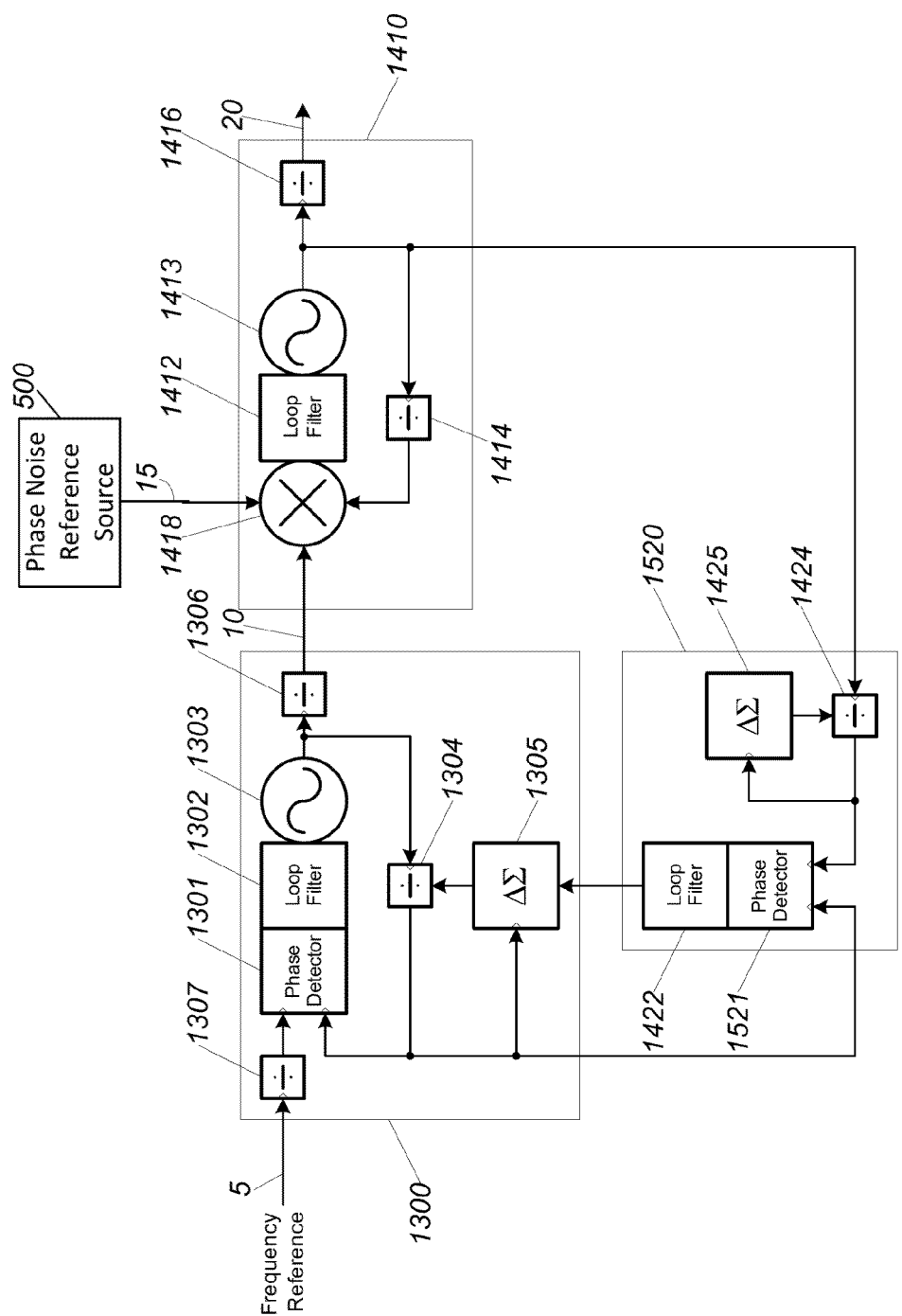
FIG. 16 illustrates another 3-PLL Nested Down-Conversion Based LO Clock Generator with Optimized Phase Detector Clocking according to an embodiment of the present disclosure.

FIG. 16 shows a variant of the embodiment of FIG. 15. The variant of FIG. 16 comprises, rather than the Integer-N PLL 1210 of FIG. 15, an Integer-N PLL 1410 that comprises a triple-input mixer 1418, which can be the same as used in the example of FIG. 14C.

Figure 17:
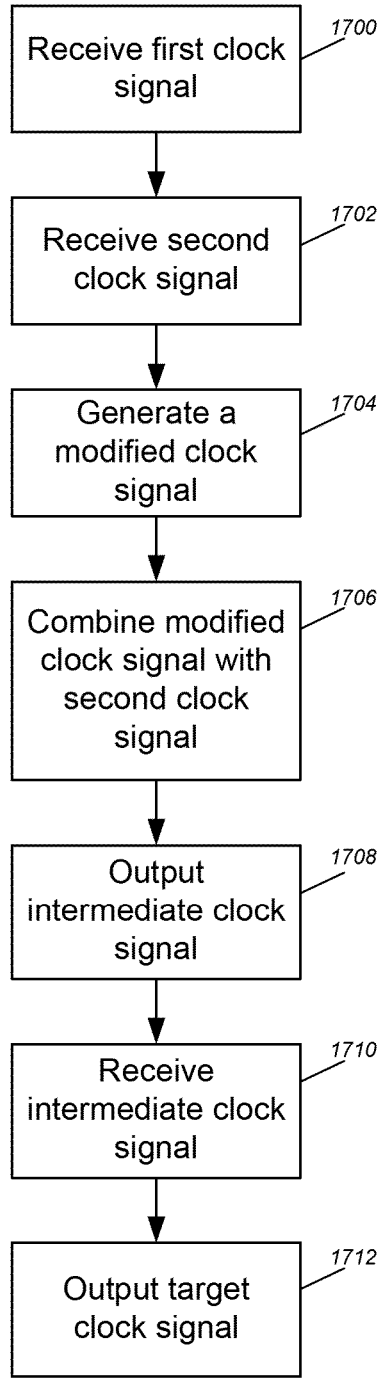
FIG. 17 illustrates an embodiment of a method in accordance with the present disclosure.

FIG. 17 is a flowchart of a method according to the present disclosure. The method shown can be implemented using, for example, the embodiment of FIG. 10 or the embodiment of FIG. 11.

The method begins at a Fractional-N PLL (FNPLL) circuit where, at action 1700, a first clock signal is received. The first clock signal can be Frequency Reference signal. Subsequently, at action 1702, a second clock signal is received. The second clock signal is unrelated to the first clock signal. "Unrelated" is to be understood as meaning that the second clock signal is generated by clock source that is different from the clock source that generates the first clock signal. The second clock signal can be a Phase Noise reference signal. At action 1704, a modified clock signal is generated as a function of the first clock signal and as a function of the second clock signal. Subsequently, at a mixer comprised in the Fractional-N PLL circuit, the modified clock signal is combined, at action 1706, with the second clock signal to obtain a signal having a frequency sum component and a frequency difference component. Following this, an intermediate clock that is a function of the frequency of the frequency sum component is output. The Fractional-N PLL circuit has an FNPLL bandwidth selected (engineered, designed) to filter out Phase Noise present in the first clock signal.

At an Integer-N PLL circuit, the intermediate clock signal is received at action 1710 and, at action 1712, a target clock signal is output as a function of the intermediate clock signal and as a function of a feedback signal. The Integer-N PLL circuit has an INPLL bandwidth selected (engineered, designed) to filter out Phase Noise generated by components of the INPLL circuit.

Figure 18:
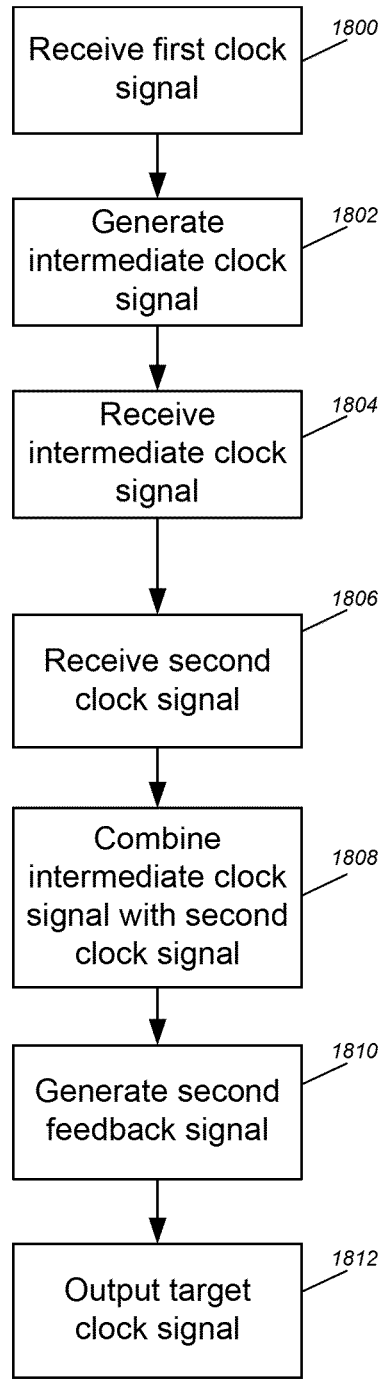
FIG. 18 illustrates another embodiment of a method in accordance with the present disclosure.

FIG. 18 is a flowchart of a method according to the present disclosure. The method shown can be implemented using, for example, the embodiment of FIG. 12, Figure or FIG. 15.

The method begins at a Fractional-N PLL circuit where, at action 1800, a first clock signal is received. The first clock signal can be Frequency Reference signal. At action 1802, an intermediate clock signal is generated as a function of the first clock signal and as a function of a first feedback signal. The Fractional-N PLL has a bandwidth selected to filter out Phase Noise present in the first clock signal.

Subsequently, at an Integer-N phase locked loop (INPLL) circuit, the intermediate clock signal is received at action 1804. At action 1806, a second clock signal is received. The second clock signal is unrelated to the first clock signal. Then, at action 1808, with a mixer, the intermediate clock signal is combined with the second clock signal to obtain a signal having a frequency sum component and a frequency difference component. At action 1810, a second feedback clock signal is generated as a function of the frequency difference component. Finally, at action 1812, the target clock signal is output, the target clock signal is a function of the intermediate clock signal and of the second feedback signal.

Figure 19:
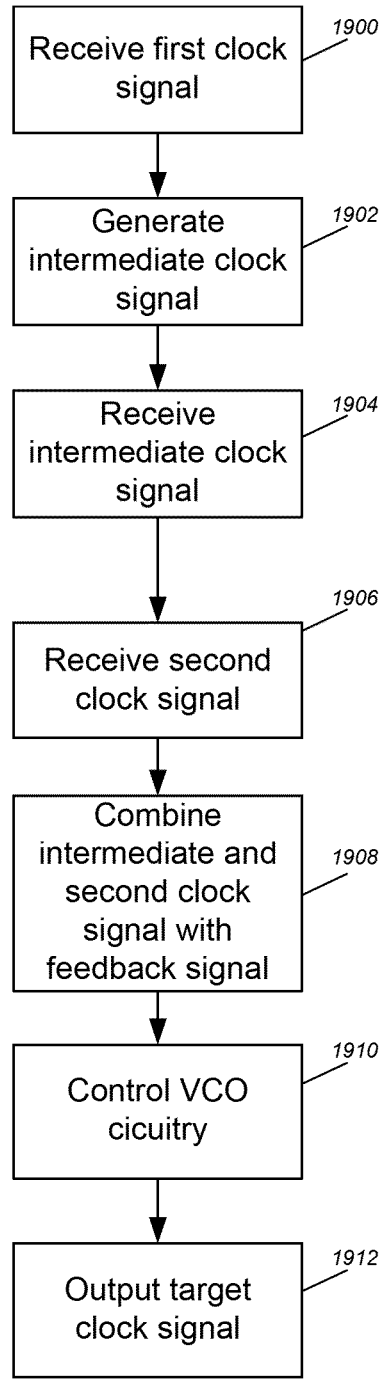
FIG. 19 illustrates yet another embodiment of a method in accordance with the present disclosure.

FIG. 19 is a flowchart of a method according to the present disclosure. The method shown can be implemented using, for example, the embodiment of FIG. 14B, FIG. 14C or FIG. 16.

The method begins at a Fractional-N PLL circuit where, at action 1900, a first clock signal is received. The first clock signal can be Frequency Reference signal. At action 1902, an intermediate clock signal is generated as a function of the first clock signal and as a function of a first feedback signal. The Fractional-N PLL has an FNPLL bandwidth selected to filter out Phase Noise present in the first clock signal.

Subsequently, at an Integer-N PLL circuit, the intermediate clock signal is received at action 1904 and, a second clock signal is received at action 1906. The second clock signal is unrelated to the first clock signal. Then, at action 1908, at a triple-input mixer comprised in the Integer-N PLL circuit, the intermediate clock signal is combined with the second clock signal and with a second feedback signal received from voltage-controlled oscillator (VCO) circuitry of the Integer-N PLL circuit. The output of the triple-input mixer is a resulting signal that has signal components at a plurality of frequencies. One of the plurality of frequencies is the closest to DC and one of the resulting signal components is at the frequency closest to DC. Subsequently, at action 1910, VCO circuitry of the Integer-N PLL is controlled as a function of the resulting signal component at the frequency closest to DC. Finally, at action 1912, the target clock signal is output, the target signal being a function of the second feedback signal. The Integer-N PLL circuit has an INPLL bandwidth selected to filter out Phase Noise generated by components of its VCO circuitry.

There are many advantages that embodiments of the present disclosure allow in the construction of RF systems, including at least one of the following: the creation of an integrated low Phase Noise LO clock that meets challenging RF Phase Noise requirements such as those in GSM; sufficient tuning range for multiple carrier applications covering applications requiring LO clocks from approximately 700 MHz to 2 GHz, while providing frequency resolution of approximately 100 kHz; and the low Phase Noise LO clock generation is fully integrated with the rest of the RF sub-components in a single-package, single-die device. The Phase Noise Reference can be based on, for example, a BAW or MEMS resonator mounted in an IC device package, or micromachined on semiconductor die.

The embodiments of the present disclosure allow single-package integration of multiple components to create a high quality LO clock source using a CMOS process. This application has traditionally required a bipolar process, and often has required multiple devices in multiple packages connected on a printed circuit board.

Generating a fully-integrated wide tuning range, low Phase Noise clock that meets GSM RF specifications is a challenge and problem to solve. A number of methods have been disclosed to produce this wide tuning range, low Phase Noise clock for use in integrated Radio Frequency systems.

The methods all use two reference clocks: a frequency-accurate reference that has comparatively high Phase Noise, and a frequency-inaccurate reference that has comparatively low Phase Noise. By combining multiple Phase-Locked Loops and at least one mixer, it has been shown how flexible output frequencies, whose frequency accuracy is derived from the first reference clock but whose Phase Noise is derived from the second reference clock, can be produced in a readily-integrated and relatively low-cost system. Two general embodiments of the invention have been disclosed: Up-Conversion based and Down-Conversion based.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A clock generator unit to generate a target clock signal having a target frequency, the clock generator unit comprising:
    a Fractional-N phase-locked loop (FNPLL) circuit having:
        first phase detector circuitry having a FNPLL reference input terminal and a FNPLL feedback input terminal, the FNPLL reference input terminal to receive a first clock signal, the first clock signal having associated thereto first clock signal Phase Noise;
        first voltage-controlled oscillator (VCO) circuitry operationally connected to the first phase detector circuitry, the first VCO circuitry to receive an output from the first phase detector circuitry, the FNPLL circuit configured to have a FNPLL bandwidth that filters out the first clock signal Phase Noise, the FNPLL circuit being configured to generate an intermediate clock signal that is substantially free of the first clock signal Phase Noise;
    an Integer-N PLL (INPLL) circuit having:
        second phase detector circuitry;
        second VCO circuitry operationally connected to the second phase detector circuitry, the second phase detector circuitry having an INPLL reference input terminal and an INPLL feedback input terminal, the INPLL reference input terminal to receive the intermediate clock signal from the FNPLL circuit, the second VCO circuitry to output the target clock signal, the FNPLL feedback input terminal of the first phase detector circuitry being operationally connected to the second VCO circuitry to receive, as an FNPLL feedback signal, a signal that is a function of the target clock signal;
        mixer circuitry to receive a second clock signal and an output signal from the second VCO circuitry, the second clock signal being unrelated to the first clock signal, the mixer circuitry to generate a mixer output signal that comprises a sum signal and a difference signal, the sum signal being at a sum frequency that is a function of a sum of the frequency of the second clock signal and the frequency of the output signal of the second VCO circuitry, the difference signal being at a difference frequency that is a function a difference between the frequency of the second clock signal and the frequency of the output signal of the second VCO circuitry; and filter circuitry operationally connected to the mixer circuitry, the filter circuitry to receive the mixer output signal and to generate an INPLL feedback signal that is a function of the difference signal, the filter circuitry being operationally connected to the second phase detector circuitry to provide the INPLL feedback signal to the INPLL input terminal, the INPLL circuit being configured to have an INPLL bandwidth that filters out Phase Noise generated by the second VCO circuitry.

2. The clock generator unit of claim 1 wherein the FNPLL circuit further has Fractional-N divider circuitry configured to receive, from the second VCO circuitry, a signal that is a function of the target clock signal, the divider circuitry to generate the FNPLL feedback signal, a frequency of the target clock signal being determined by at least settings of the Fractional-N divider circuitry.

3. The clock generator unit of claim 1 wherein:
the first VCO circuitry has a VCO and a VCO divider, the VCO divider to receive a VCO signal from the VCO and to frequency-divide the VCO signal to obtain a frequency-divided VCO signal, the frequency-divided VCO signal being the intermediate clock signal, the VCO signal having VCO Phase Noise, the intermediate clock signal having lower dBc/Hz Phase Noise than the VCO signal.

4. The clock generator unit of claim 1 further comprising a clock source to generate the second clock signal.

5. The clock generator unit of claim 4 wherein the clock source is one of a bulk-acoustic-wave resonator clock source, a micro electro-mechanical system resonator clock source, a surface-acoustic wave resonator clock source and a quartz clock source.

6. The clock generator unit of claim 4 wherein the Fractional-N PLL circuit, the Integer-N PLL circuit and the clock source are packaged as a unit.

7. The clock generator unit of claim 1 wherein:
the first phase detector circuitry further has a prescaler divider and a phase detector, the prescaler divider having an input terminal to receive the first clock signal, the input terminal of the prescaler divider being the FNPLL reference input terminal, the phase detector having a phase detector reference input terminal, the prescaler divider to output a frequency divided first clock signal to the phase detector reference input terminal.

8. A clock generator unit to generate a target clock signal having a target frequency, the target clock signal having a frequency accuracy that is a function of a frequency accuracy of a first clock signal, the target clock signal having associated thereto target clock signal phase noise that is a function of phase noise of a second clock signal, the clock generator unit comprising:
a Fractional-N phase-locked loop (FNPLL) circuit having:
first phase detector circuitry having a FNPLL reference input terminal and a FNPLL feedback input terminal, the FNPLL reference input terminal to receive a first clock signal, the first clock signal having associated thereto first clock signal Phase Noise and a first clock signal frequency;

first voltage-controlled oscillator (VCO) circuitry operationally connected to the first phase detector circuitry, the first VCO circuitry to receive an output from the first phase detector circuitry, the FNPLL circuit configured to have a FNPLL bandwidth that filters out the first clock signal Phase Noise, the FNPLL circuit being configured to generate an intermediate clock signal that is substantially free of the first clock signal Phase Noise;

an Integer-N PLL (INPLL) circuit having:
second phase detector circuitry;
second VCO circuitry operationally connected to the second phase detector circuitry, the second phase detector circuitry having an INPLL reference input terminal and an INPLL feedback input terminal, the INPLL reference input terminal to receive the intermediate clock signal from the FNPLL circuit, the second VCO circuitry to output the target clock signal, the FNPLL feedback input terminal of the first phase detector circuitry being operationally connected to the second VCO circuitry to receive, as an FNPLL feedback signal, a signal that is a function of the target clock signal;

mixer circuitry to receive a second clock signal and an output signal from the second VCO circuitry, the second clock signal being unrelated to the first clock signal, the mixer circuitry to generate a mixer output signal that comprises a sum signal and a difference signal, the sum signal being at a sum frequency that is a function of a sum of the frequency of the second clock signal and the frequency of the output signal of the second VCO circuitry, the difference signal being at a difference frequency that is a function a difference between the frequency of the second clock signal and the frequency of the output signal of the second VCO circuitry; and filter circuitry operationally connected to the mixer circuitry, the filter circuitry to receive the mixer output signal and to generate an INPLL feedback signal that is a function of the difference signal, the filter circuitry being operationally connected to the second phase detector circuitry to provide the INPLL feedback signal to the INPLL input terminal, the INPLL circuit being configured to have an INPLL bandwidth that filters out Phase Noise generated by the second VCO circuitry.

9. The clock generator unit of claim 8 wherein the FNPLL circuit further has Fractional-N divider circuitry configured to receive a signal that depends on the target clock signal and to generate the FNPLL feedback signal, a frequency of the target clock signal being determined by at least settings of the Fractional-N divider circuitry.

10. The clock generator unit of claim 8 wherein:
the first VCO circuitry has a VCO and a VCO divider, the VCO divider to receive a VCO signal from the VCO and to frequency-divide the VCO signal to obtain a frequency-divided VCO signal, the frequency-divided VCO signal being the intermediate clock signal, the VCO signal having VCO Phase Noise, the intermediate clock signal having lower dBc/Hz Phase Noise than the VCO signal.

11. The clock generator unit of claim 8 further comprising a clock source to generate the second clock signal.

12. The clock generator unit of claim 11 wherein the clock source is one of a bulk-acoustic-wave resonator clock source, a micro electro-mechanical system resonator clock source, a surface-acoustic wave resonator clock source and a quartz clock source.

13. The clock generator unit of claim 11 wherein the Fractional-N PLL circuit, the Integer-N PLL circuit and the clock source are packaged as a unit.

14. The clock generator unit of claim 8 wherein:
the first phase detector circuitry further has a prescaler divider and a phase detector, the prescaler divider having an input terminal to receive the first clock signal, the input terminal of the prescaler divider being the FNPLL reference input terminal, the phase detector having a phase detector reference input terminal, the prescaler divider to output a frequency divided first clock signal to the phase detector reference input terminal.

* * * * *